US009001871B2

(12) United States Patent
Tomisawa et al.

(10) Patent No.: US 9,001,871 B2
(45) Date of Patent: Apr. 7, 2015

(54) HIGH-FREQUENCY SIGNAL PROCESSOR AND WIRELESS COMMUNICATION SYSTEM

(71) Applicant: Renesas Electronics Corporation, Kawasaki-shi, Kanagawa (JP)

(72) Inventors: Satoru Tomisawa, Kawasaki (JP); Hiroaki Matsui, Kawasaki (JP); Kazuaki Hori, Kawasaki (JP); Tetsuya Wakuda, Kawasaki (JP); Sungwoo Cha, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 70 days.

(21) Appl. No.: 13/659,379

(22) Filed: Oct. 24, 2012

(65) Prior Publication Data

US 2013/0107918 A1     May 2, 2013

(30) Foreign Application Priority Data

Nov. 1, 2011 (JP) .................................. 2011-239887

(51) Int. Cl.
*H04B 1/38*     (2006.01)
*H04L 5/16*     (2006.01)
*H04B 17/00*   (2006.01)

(52) U.S. Cl.
CPC ........ *H04B 17/0062* (2013.01); *H04B 17/0015* (2013.01)

(58) Field of Classification Search
None
See application file for complete search history.

(56) References Cited

U.S. PATENT DOCUMENTS

| | | | | | |
|---|---|---|---|---|---|
| 6,009,317 | A | * | 12/1999 | Wynn | 455/296 |
| 6,330,290 | B1 | * | 12/2001 | Glas | 375/324 |
| 8,160,178 | B2 | * | 4/2012 | Toyota et al. | 375/308 |
| 2005/0018788 | A1 | * | 1/2005 | Talwalkar et al. | 375/301 |

FOREIGN PATENT DOCUMENTS

| | | |
|---|---|---|
| JP | 2004-336822 A | 11/2004 |
| JP | 2009-212869 A | 9/2009 |

* cited by examiner

*Primary Examiner* — Chieh M Fan
*Assistant Examiner* — Wednel Cadeau
(74) *Attorney, Agent, or Firm* — Foley & Lardner LLP

(57) ABSTRACT

There is a need to reduce secondary intermodulation distortion that may occur in a reception circuit of a high-frequency signal processor and a wireless communication system having the same. In test mode, for example, a test signal generating circuit TSGEN generates a test signal RFtst at f_tx ±0.5 MHz. The test signal RFtst is input to a mixer circuit MIXrx_I (MIXrx_Q). A correction circuit block CALBK detects an IM2 component resulting from the MIXrx_I (MIXrx_Q). The CALBK varies a differential balance for the MIXrx_I (MIXrx_Q) and concurrently monitors a phase for the IM2 component resulting from MIXrx_I (MIXrx_Q). The CALBK searches for the differential balance corresponding to a transition point that allows the phase to transition by approximately 180°. The MIXrx_I (MIXrx_Q) operates in normal mode using the differential balance as a search result.

3 Claims, 15 Drawing Sheets

VARY I-side IM2 CORRECTION PARAMETER (Pi).
FIND Pi VALUE Ii WHEN I-side IM2_I IS MINIMIZED.
FIND Pi VALUE Qi WHEN Q-side IM2_Q IS MINIMIZED.
SET Q-side IM2 CORRECTION PARAMETER (Pq) TO 0.

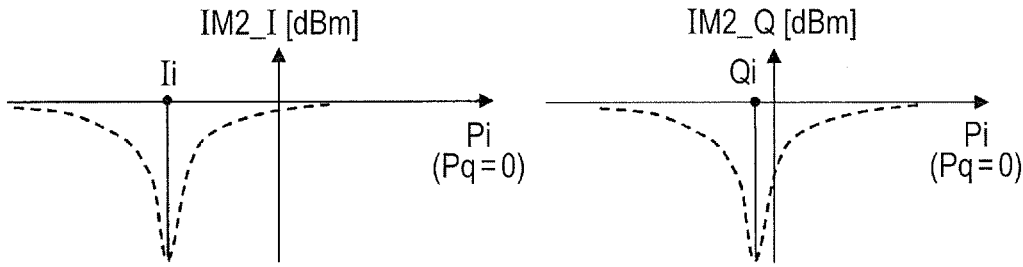

⇩

S1202

VARY Q-side IM2 CORRECTION PARAMETER (Pq).
FIND Pq VALUE Iq WHEN I-side IM2_I IS MINIMIZED.
FIND Pq VALUE Qq WHEN Q-side IM2_Q IS MINIMIZED.
SET I-side CORRECTION PARAMETER (Pi) TO 0.

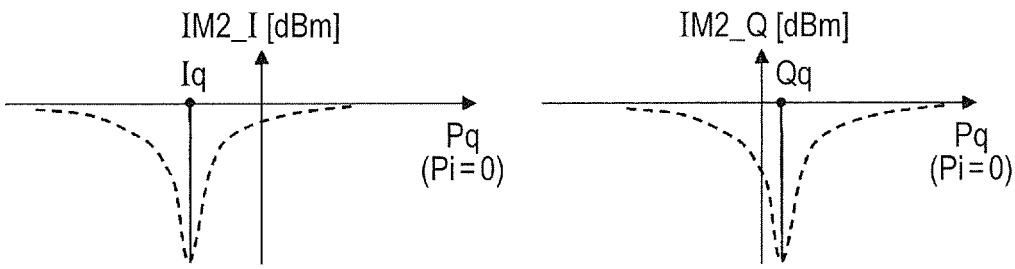

⇩

S1203

EQUATIONS (1) AND (2) FIND Ical AND Qcal EQUAL TO
OPTIMUM CORRECTION SETTING VALUES THAT MINIMIZE IM2
AFTER TAKING IQ INTERFERENCE INTO CONSIDERATION.
SUPPLY Ical AND Qcal WITH CORRECTION PARAMETERS FOR
I-side AND Q-side, RESPECTIVELY.

$$Ical = Ii \cdot Qi \cdot \frac{Iq - Qq}{Iq \cdot Qi - Ii \cdot Qq} \quad \cdots (1)$$

$$Qcal = Qq \cdot Iq \cdot \frac{Qi - Ii}{Qi \cdot Iq - Qq \cdot Ii} \quad \cdots (2)$$

LNA OUT

MIX OUT

HIGH-FREQUENCY SIGNAL PROCESSOR AND WIRELESS COMMUNICATION SYSTEM

CROSS-REFERENCE TO RELATED APPLICATIONS

The disclosure of Japanese Patent Application No. 2011-239887 filed on Nov. 1, 2011 including the specification, drawings and abstract is incorporated herein by reference in its entirety.

BACKGROUND

The present invention relates to a high-frequency signal processor and a wireless communication system. More particularly, the invention relates to a technology effectively applicable to a high-frequency signal processor having a direct conversion receiver and a wireless communication system.

As described in patent document 1; for example, the direct conversion receiver reduces secondary distortion generated in the mixer using the following circuits. One circuit supplies the mixer with a test signal having a predetermined frequency interval. Another circuit detects secondary distortion generated in the mixer. Still another circuit controls mixer parameters based on the detection result. This configuration searches for a mixer parameter to minimize the secondary distortion in the mixer. When detecting the secondary distortion in the mixer, the receiver detects an output amplitude magnitude from the mixer based on a specific frequency causing the secondary distortion.

Patent document 2 describes the technology that allows a direct conversion transmitter to reduce carrier leakage occurring in a first modulator (I-signal mixer circuit) and a second modulator (Q-signal mixer circuit). For example, carrier leakage may be reduced in the first modulator. For this purpose, the transmitter detects a phase difference between a local signal for the first modulator and an added output signal from the first modulator and the second modulator while changing a differential balance for the first modulator. The transmitter searches for a differential balance that allows the phase difference to reach a specified value (90°), namely that allows the carrier leakage to remain in only the second modulator.

Patent document 1: Japanese patent laid-open No. 2004-336822

Patent document 2: Japanese patent laid-open No. 2009-212869

SUMMARY

FIG. 15 is a block diagram illustrating a concise configuration example in a wireless communication system as a prerequisite for the present invention. For example, the wireless communication system is represented as a mobile telephone. As illustrated in FIG. 15, The wireless communication system includes a high-frequency signal processing chip (high-frequency signal processor) RFIC' that mainly converts a frequency between a baseband frequency band and a high frequency band (Radio Frequency (RF) band). The RFIC' includes a low-noise amplifier circuit LNA, a mixer circuit MIX, and a driver circuit (variable amplifier circuit) DRV as reception circuits. The low-noise amplifier circuit LNA amplifies a high-frequency signal received at an antenna ANT. The mixer circuit MIX is provided after the low-noise amplifier circuit LNA and converts a high frequency band into the baseband. The RFIC' includes a driver circuit (variable amplifier circuit) DRV as a transmission circuit. The DRV is provided before a high-frequency power amplifier circuit HPA.

For example, a SAW (Surface Acoustic Wave) filter SAWrx is provided between LNA and MIX. The SAWrx is externally added to the chip and removes an unnecessary frequency band other than the reception band. A SAW filter SAWtx is provided between DRV and HPA. The SAWtx is externally added to the chip and removes an unnecessary frequency band other than the transmission band. Recently, there is an increasing demand for miniaturizing the wireless communication system including the high-frequency signal processing chip and reducing costs on the system. Therefore, the high-frequency signal processing chip needs to eliminate the SAW filters.

If the SAW filter is eliminated, however, a leakage signal from the transmission circuit may be superposed on a targeted baseband signal via a secondary intermodulation distortion (IM2) in the reception circuit. FIGS. 16A through 16C are explanatory diagrams illustrating a problem on the high-frequency signal processor as a prerequisite for the present invention. For example, the FDD (Frequency Division Duplex) system includes W-CDMA (Wideband Code Division Multiple Access) and LTE (Long Term Evolution). The high-frequency power amplifier circuit HPA illustrated in FIG. 15 may output a transmission signal having a large amount of power. The transmission signal may then leak to the reception circuit via a duplexer DPX. FIG. 16A illustrates an output frequency spectrum in the reception circuit in this situation.

As illustrated in FIG. 16A, the LNA is supplied with a high-frequency signal (targeted wave signal) RFrx within the reception band and a transmission leakage signal RFtx_L from the HPA. The LNA amplifies these signals and outputs a result. The RFrx is received at the antenna ANT. The RFrx has a specified signal band ($2 \cdot f\_BB$) at several megahertzes. Similarly, the RFtx_L also has a specified signal band. In the example, the signal band for the RFtx_L is represented as two frequency spectra having a specified frequency interval (f_int) such as 1 MHz. The RFtx_L is sufficiently suppressed at the input and output of the LNA if the SAWtx and the SAWrx are available. The RFtx_L is not suppressed and is supplied to the mixer circuit MIX if the SAWtx and the SAWrx are unavailable.

FIG. 16B illustrates a local signal (locally-generated signal) LOrx configured for a specified channel frequency in the reception band. The mixer circuit MIX multiplies the LOrx by the targeted wave signal RFrx. As illustrated in FIG. 16C, the MIX directly down-coverts the RFrx into the baseband frequency band (f_BB) as frequency conversion and outputs a resulting reception baseband signal BBrx. Here, the mixer circuit MIX may generate an IM2 component because of a device mismatch. The MIX generates an interfering wave at the frequency of f_int if the MIX generates the IM2 component because of the transmission leakage signal RFtx_L. As illustrated in FIG. 16C, the interfering wave (f_int) is superposed on the frequency band (f_BB) for a reception baseband signal BBrx. Hence, a normal reception operation is difficult.

To solve the problem of the IM2, the technology described in patent document 1 may be used. The system used in patent document 1 observes the amplitude level magnitude of the IM2 component and searches for a correction parameter that minimizes the magnitude. For this purpose, the system searches the I-signal mixer circuit and the Q-signal mixer circuit independently of each other. Alternatively, the system searches one of the mixer circuits. The system applies the search result to the other mixer circuit, assuming that the other mixer circuit yields the same search result. Hence, the following problems may arise.

(1) The amplitude level of the IM2 component is very small near a position (optimum correction point) where the IM2 is minimized. The detection itself may be difficult. If the amplitude level is detected, optimum correction points may vary to some extent depending on the detection accuracy for the amplitude level. It may be difficult to settle highly accurately the optimum correction point or highly accurately search for the minimum IM2 point and reduce the IM2. (2) Correcting the I-signal mixer circuit changes the optimum correction point for the Q-signal mixer circuit. By contrast, correcting the Q-signal mixer circuit changes the optimum correction point for the I-signal mixer circuit. This IQ interference problem cannot be solved.

(3) Searching for the minimum IM2 point (optimum correction point) may be time-consuming. A search for the minimum point for the IM2 amplitude level may analogize with a search for the local minimum point of a U-shaped or V-shaped curve. For example, an actual, possible search method aims at a minimum point by roughly estimating correction variables over an entire variable range. The method then varies the vicinity of the aimed minimum point. However, this search method may require many processing steps. In addition, the method needs to repeatedly correct the I-signal mixer circuit and the Q-signal mixer circuit if the IQ interference problem (2) above needs to be solved. As a result, the search time may increase drastically.

The present invention has been made in consideration of the foregoing. The invention aims at reducing secondary intermodulation distortion that may result from a reception circuit in a high-frequency signal processor and a wireless communication system having the same. These and other objects and novel features of the invention may be readily ascertained by referring to the following description and appended drawings.

The following summarizes representative embodiments of the invention disclosed in this application.

A high-frequency signal processor according to an embodiment of the invention is provided with a first operation mode and a second operation mode, and includes a test signal generating circuit, a first switch, a mixer circuit, a phase detection portion, and a control portion. The test signal generating circuit generates a test signal having a first frequency component and a second frequency component. The first switch (SWr) transmits a signal received as a first signal at an antenna in the first operation mode and transmits the test signal as the first signal in the second operation mode. The mixer circuit (MIXrx_I or MIXrx_Q) includes a differential circuit capable of correcting a differential balance within a specified variable range and down-converts the first signal to a second signal having a frequency band lower than the first signal. The phase detection portion (PHDET) extracts a third signal from the second signal in the second operation mode and detects a phase for the third signal. The third signal has a frequency component equivalent to a difference between the first frequency component and the second frequency component. The control portion (DGCTL) changes the differential balance for the mixer circuit according to a detection result from the phase detection portion. The mixer circuit operates in the first operation mode while the differential balance is set to a first correction value within a variable range. In the second operation mode, the control portion varies the differential balance and concurrently searches for a transition point allowing a phase for the third signal to transition by approximately 180° before and after varying the differential balance within a minimum fluctuation range. The control portion supplies the mixer circuit with the first correction value, namely, the differential balance corresponding to the transition point.

According to the above-mentioned configuration, correcting the differential balance for the mixer circuit can reduce a secondary intermodulation distortion (IM2) component resulting from the mixer circuit. The high-frequency signal processor searches for an optimum correction value for the differential balance while monitoring phase information about the IM2 component output from the mixer circuit. This enables to facilitate the correction, provide highly accurate correction, and shorten the correction time. Particularly, a binary search for the differential balance can moreover shorten the correction time.

An effect of the representative embodiment discussed in the present invention is briefly summarized as being capable of reducing secondary intermodulation distortion that may occur in a reception circuit of a high-frequency signal processor and a wireless communication system having the same.

BRIEF DESCRIPTION OF THE DRAWINGS

FIG. 12 is an explanatory diagram illustrating an example method for the high-frequency signal processor according to the second embodiment of the invention to search for an optimum correction point;

FIGS. 16A through 11C illustrate an example problem in a high-frequency signal processor as a prerequisite for the present invention.

DETAILED DESCRIPTION

Figure 1:
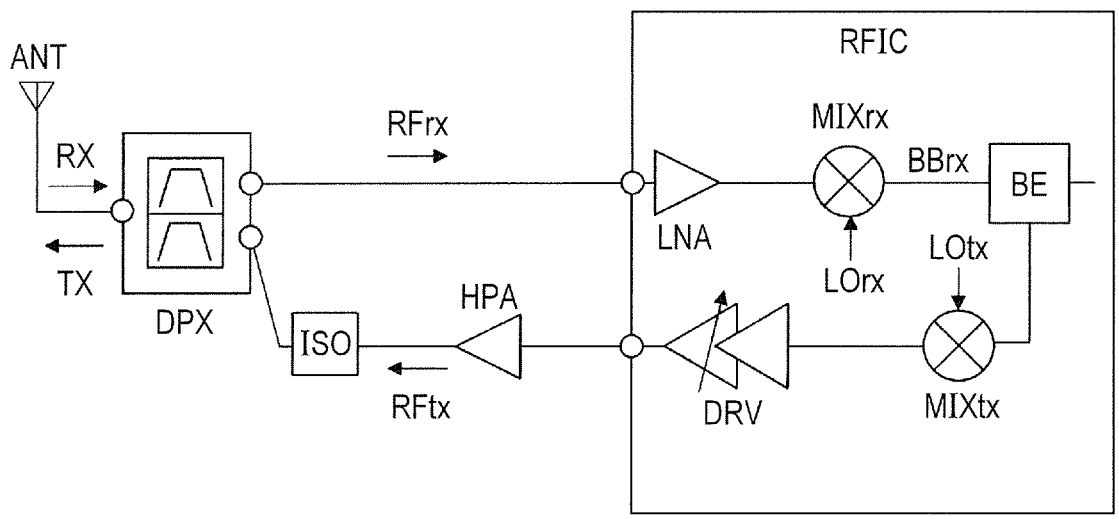
FIG. 1 is a block diagram illustrating a concise configuration example of major parts of the wireless communication system according to a first embodiment of the invention.

The following description is divided into sections or embodiments as needed. These are related to each other unless explicitly stated otherwise. One section or embodiment may represent a modification, details, or supplementary description for all or part of the others. The embodiments may refer to the number of elements including the number of items, numeric values, quantities, and ranges. The embodiments are not limited to specific values unless explicitly stated otherwise or unless the embodiment or embodiments are unquestionably limited to specific values in principle. For example, the embodiment or embodiments may be greater, smaller than, or equal to a specific value.

Constituent elements (including process steps) of the embodiments are not necessarily required unless explicitly stated otherwise or unless the constituent elements are unquestionably required in principle. Similarly, the embodiments may refer to shapes or positional relationship among the constituent elements. The embodiments include an equivalent substantially similar or approximate to the shapes unless explicitly stated otherwise or unless the equivalent is unquestionably unavailable in principle. The same applies to the above-mentioned numeric values and ranges.

A circuit element configures each function block according to the embodiments. The circuit element is formed on a semiconductor substrate made of single-crystal silicon according to a known integrated-circuit technology for CMOS (complementary metal-oxide semiconductor), though not limited thereto. The embodiments use MOSFET (Metal Oxide Semiconductor Field Effect Transistor) (abbreviated to a MOS transistor) as an example of MISFET (Metal Insulator Semiconductor Field Effect Transistor). Gate insulator films may include a non-oxidizing film.

Embodiments of the present invention will be described in further detail with reference to the accompanying drawings. Throughout the drawings for illustrating the embodiments, the same members are generally designated by the same reference numerals and a repetitive description is omitted for simplicity.

First Embodiment

Entire configuration of a wireless communication system

FIG. 1 is a block diagram illustrating a concise configuration example of major parts of the wireless communication system according to the first embodiment of the invention. The wireless communication system illustrated in FIG. 1 typically represents but is not limited to a mobile telephone system for W-CDMA (Wideband Code Division Multiple Access) and LTE (Long Term Evolution). The wireless communication system illustrated in FIG. 1 includes a high-frequency signal processor chip (high-frequency signal processor) RFIC, a high-frequency power amplifier circuit HPA, an isolator ISO, a duplexer DPX, and an antenna ANT. The RFIC includes one semiconductor chip, for example. The RFIC includes a low-noise amplifier circuit LNA and a reception mixer circuit MIXrx as reception circuits. The RFIC includes a driver circuit (variable amplifier circuit) DRV and a transmission mixer circuit MIXtx as transmission circuits. The RFIC includes a back-end circuit BE as a transmission/reception circuit. The BE includes a baseband processor such as a CPU (Central Processing Unit) or an application processor, for example.

During transmission, the transmission mixer circuit MIXtx in the RFIC up-converts (frequency conversion) a transmission baseband signal from the BE using a local signal (locally-generated signal or carrier signal) LOtx having a specified frequency (a specific frequency in the transmission frequency band). The DRV linearly amplifies an output signal from the MIXtx at a specified gain and outputs the signal to the HPA. The HPA is configured as one semiconductor chip, for example. The HPA is provided with an HBT (Heterojunction Bipolar Transistor) using composite semiconductor, though not limited thereto. The HPA amplifies the power of an output signal from the DRV. The HPA outputs the amplified high-frequency signal RFtx to the DPX via the ISO. The ISO passes through the signal output from the HPA to the DPX and blocks a reverse signal.

The DPX separates a transmission frequency band from a reception frequency band. Specifically, the DPX selects a specified transmission frequency band from the high-frequency signal RFtx output via the ISO. The DPX transmits the selected transmission frequency band as a transmission power signal TX to the ANT. The DPX selects a specified reception frequency band from a reception power signal RX received at the ANT. The DPX transmits the selected reception frequency band as a high-frequency signal RFrx to the LNA in the RFIC. The LNA amplifies the high-frequency signal RFrx from the DPX and outputs it to the reception mixer circuit MIXrx. The MIXrx directly down-converts (frequency conversion) the output signal from the LNA to the baseband frequency band using the local signal (locally-generated signal or carrier signal) LOrx having a specified frequency (a specific frequency in the reception frequency band). The MIXrx outputs a conversion result as the reception baseband signal BBrx to the back-end circuit BE. The BE receives the BBrx and performs a specified baseband process.

The RFIC, the HPA, the ISO, and the DPX may be mounted as independent parts on the same wiring substrate. Alternatively, the HPA, the ISO, and the DPX may be mounted on one module wiring substrate. The module wiring substrate and the RFIC may be mounted on the same wiring substrate. The wiring substrate and the module wiring substrate are typically made of ceramics. However, the invention is not limited thereto.

Figure 15:
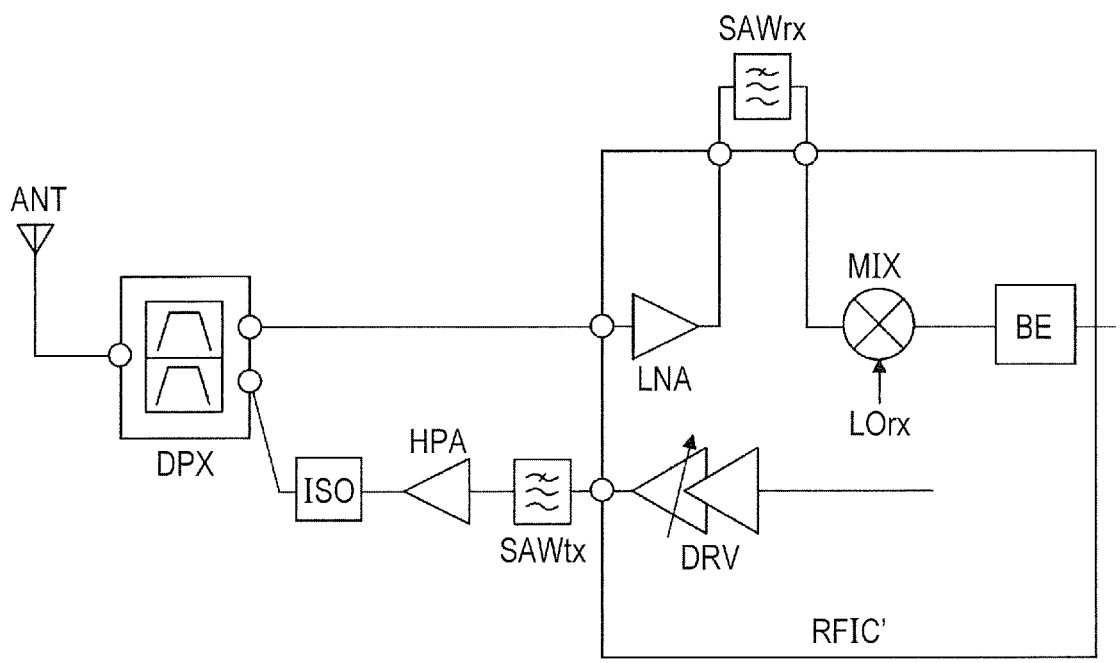
FIG. 15 is a block diagram illustrating a concise configuration example of a wireless communication system as a prerequisite for the present invention.
Figure 16A:
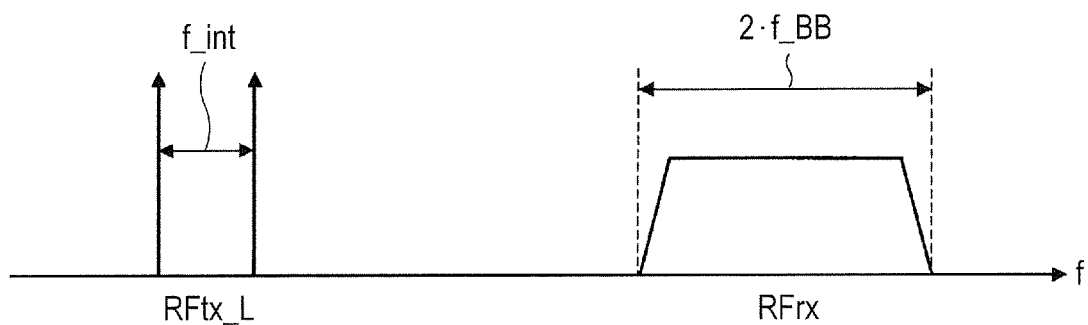
Figure 16B:
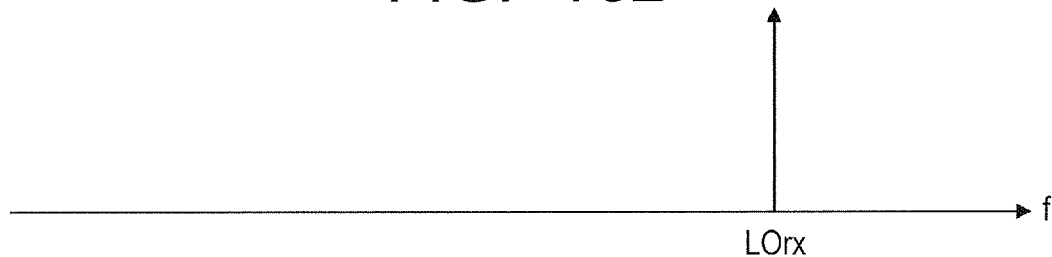
Figure 16C:
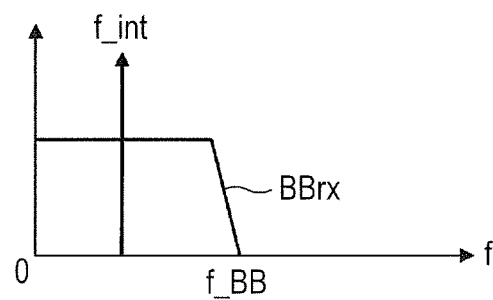

The wireless communication system illustrated in FIG. 1 is characteristically configured to remove the SAW filters SAWtx and SAWrx from the configuration example illustrated in FIG. 15. This can miniaturize the wireless communication system and reduce its cost. However, removing the SAW filters causes the problem described with reference to FIG. 16 in the FDD-based wireless communication system that performs transmission and reception in the same period. Actually, the high-frequency signal RFtx from the HPA may be supplied as a transmission leakage signal (RFtx_L) to the input side of the LNA via the DPX. Generally, a differential MIXrx is prone to a variation in the differential pair and therefore causes secondary intermodulation distortion (IM2) in response to the transmission leakage signal. As a result, an interfering wave is superposed on the baseband frequency band.

The interfering wave due to IM2 may result from the normal high-frequency signal (targeted wave signal) RFrx as well as the transmission leakage signal. According to circumstances, this problem may occur on the TDD (Time Division Duplex) system such as GSM (Global System for Mobile Communications), registered trademark, in addition to the FDD system. Normally, however, the RFtx power level is much higher than the RFrx power level. The transmission leakage signal is more critical. The use of the high-frequency signal processing chip (high-frequency signal processor) according to the embodiment, to be described later, advantageously solves the IM2 problem.

Configuration of Major Parts of the High-Frequency Signal Processor

Figure 2:
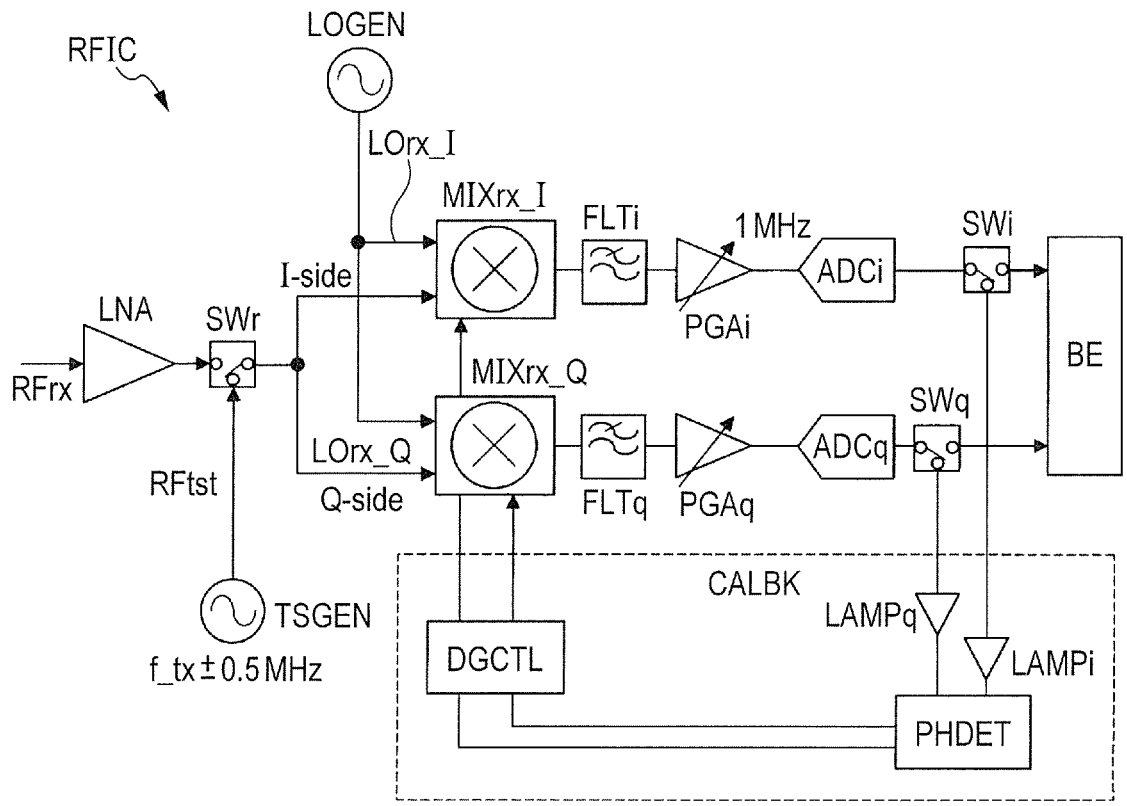
FIG. 2 is a circuit block diagram illustrating a detailed configuration example of major parts of a high-frequency signal processor in the wireless communication system illustrated in FIG. 1.

FIG. 2 is a circuit block diagram illustrating a detailed configuration example of major parts of the high-frequency signal processor in the wireless communication system illustrated in FIG. 1. FIG. 2 illustrates a detailed configuration example around the reception circuit in a high-frequency signal processor RFIC illustrated in FIG. 1. The RFIC illustrated in FIG. 2 includes a low-noise amplifier circuit LNA, a local signal generating circuit LOGEN, mixer circuits MIXrx_I and MIXrx_Q, filter circuits FLTi and FLTq, variable amplifier circuits PGAi and PGAq, analog-digital converter circuits ADCi and ADCq, and a back-end circuit BE. In addition to these circuits, the RFIC illustrated in FIG. 2 characteristically includes switches SWr, SWi, and SWq, a test signal generating circuit TSGEN, and a correction circuit block CALBK.

The SWr selects one of output signals from the LNA and the TSGEN and outputs the selected signal to the MIXrx_I and the MIXrx_Q. The MIXrx_I uses a local signal LOrx_I from the LOGEN to down-convert the output signal from the SWr to the baseband frequency band. The MIXrx_Q uses a local signal LOrx_Q from the LOGEN to down-convert the output signal from the SWr to the baseband frequency band. The signals LOrx_I and LOrx_Q are orthogonal to each other at a 90° phase. The MIXrx_I and the MIXrx_Q perform direct conversion and quadrature demodulation. Though not illustrated, the MIXrx_I and the MIXrx_Q each include a differential circuit that generates output at a positive terminal and output at a negative terminal.

The FLTi (e.g., low-pass filter) removes an unnecessary harmonic component from the output signal from the MIXrx_I. The PGAi amplifies an output signal from the FLTi based on the gain corresponding to an input range for the ADCi. The ADCi converts an output signal from the PGAi into a digital signal. The FLTq (e.g., low-pass filter) moves an unnecessary harmonic component from the output signal from the MIXrx_Q. The PGAq amplifies an output signal from the FLTq based on the gain corresponding to an input range for the ADCq. The ADCq converts an output signal from the PGAq into a digital signal. The SWi outputs an output signal from the ADCi to one of the BE and the CALBK. The SWq outputs an output signal from the ADCq to one of the BE and the CALBK.

The RFIC illustrated in FIG. 2 includes normal operation mode and calibration mode. In the normal operation mode, the SWr selects the LNA side as an input source. The SWi and the SWq select the BE side as an output destination. As an ordinary reception operation, the reception power signal RX from the antenna ANT illustrated in FIG. 1 is converted into the baseband frequency band and then is supplied to the BE. The calibration mode is used as needed for a period in the normal operation mode (e.g., a power-on sequence). In the calibration mode, the SWr selects the TSGEN side as an input source. The SWi and the SWq select the CALBK side as an output destination.

The TSGEN generates a test signal RFtst that results from modulating a high-frequency signal having a specified frequency f_tx with a 0.5 MHz signal, for example. Therefore, the RFtst contains a frequency component of f_tx±0.5 MHz. The frequency f_tx is set equally to the local signal LOtx illustrated in FIG. 1, for example. The RFtst is input to the MIXrx_I and the MIXrx_Q via the SWr. As described above, the MIXrx_I and the MIXrx_Q perform downconversion using the LOrx_I and the LOrx_Q. The secondary intermodulation distortion (IM2) occurs if a differential balance difference exits in each of the MIXrx_I and the MIXrx_Q. The IM2 frequency component is one MHz in this example. The ADCi and the ADCq convert the 1-MHz IM2 frequency component into digital signals that are then input to the CALBK via the SWi and the SWq.

The correction circuit block CALBK includes amplifier circuits LAMPi and LAMPq, a phase detection circuit PHDET, and a digital correction circuit DGCTL. The LAMPi amplifies an output signal (1-MHz in this example) from the SWi. The LAMPq amplifies an output signal (1-MHz in this example) from the SWq. The PHDET detects a phase of an output signal from the LAMPi and a phase of an output signal from the LAMPq. The DGCTL changes the differential balance for the MIXrx_I according to a result of detecting the phase of the output signal from the LAMPi in the PHDET. The DGCTL also changes the differential balance for the MIXrx_Q according to a result of detecting the phase of the output signal from the LAMPq in the PHDET.

The CALBK searches for a differential balance equivalent to a transition point at which the phase reverses approximately at 180° in the output signal from the LAMPi, while allowing the DGCTL to appropriately change the differential balance for the MIXrx_I. Similarly, the CALBK searches for a differential balance equivalent to a transition point at which the phase reverses approximately at 180° in the output signal from the LAMPq, while allowing the DGCTL to appropriately change the differential balance for the MIXrx_Q. In the normal operation mode, the MIXrx_I and the MIXrx_Q operate using the differential balance as a search result of the CALBK.

As described above, the phase for the IM2 component reverses at 180° corresponding to the differential balance that minimizes the IM2 component magnitude. The high frequency signal processor according to the first embodiment uses this characteristic to detect the 180° reversal of the phase and correct the differential balance. This can easily search for and highly accurately detect the minimum value for the IM2 component. As described above, the technique of detecting amplitude levels for the IM2 component requires comparing fine magnitude relationship among amplitude levels for the IM2 component. The detection operation itself may be difficult. Highly accurate detection may be difficult. The amplifier circuit (e.g., LAMPi or LAMPq in FIG. 2) may previously amplify the amplitude level to facilitate the detection or improve the detection accuracy. However, the amplifier circuit requires strict linearity because the technique compares the magnitude relationship among amplitude levels. As a result, the gain is limited.

The phase detection technique according to the first embodiment can solve this problem because the technique just needs to detect an obvious change, namely, the 180° reversal of the phase. Even if the IM2 component contains minute amplitude levels, the LAMPi and the LAMPq illustrated in FIG. 2 can amplify the amplitude levels to sufficient levels and detect the phase. The LAMPi and the LAMPq do not require linearity. The technique can use a high-gain amplifier circuit such as a limiting amplifier.

Figure 3A:
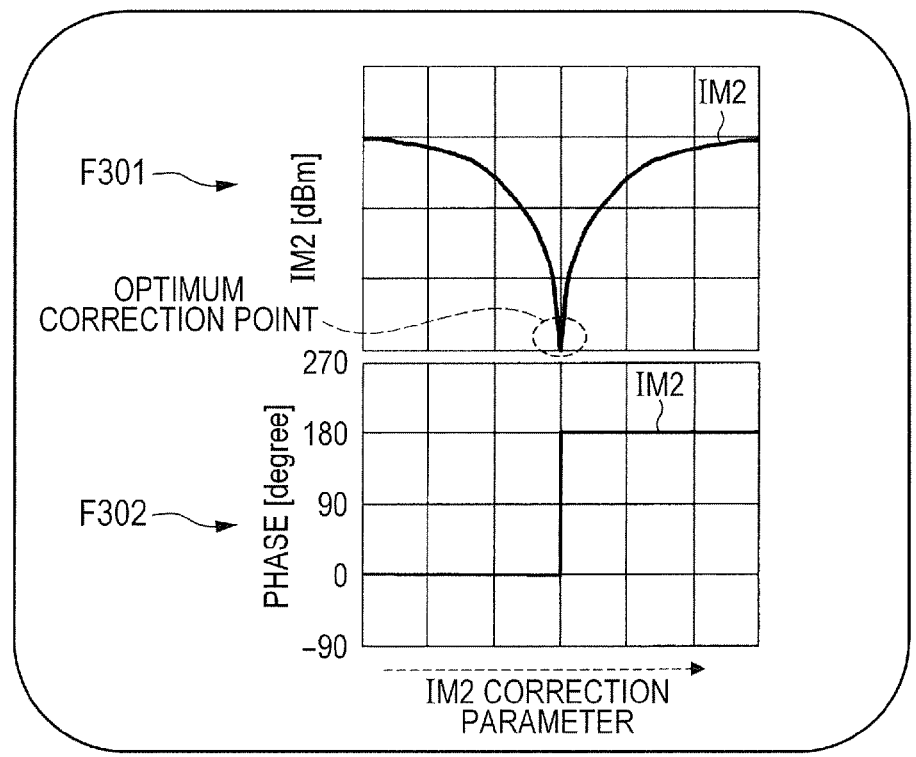
FIG. 3A is an explanatory diagram illustrating an example of IM2 characteristics in the high-frequency signal processor illustrated in FIG. 2.
Figure 3B:
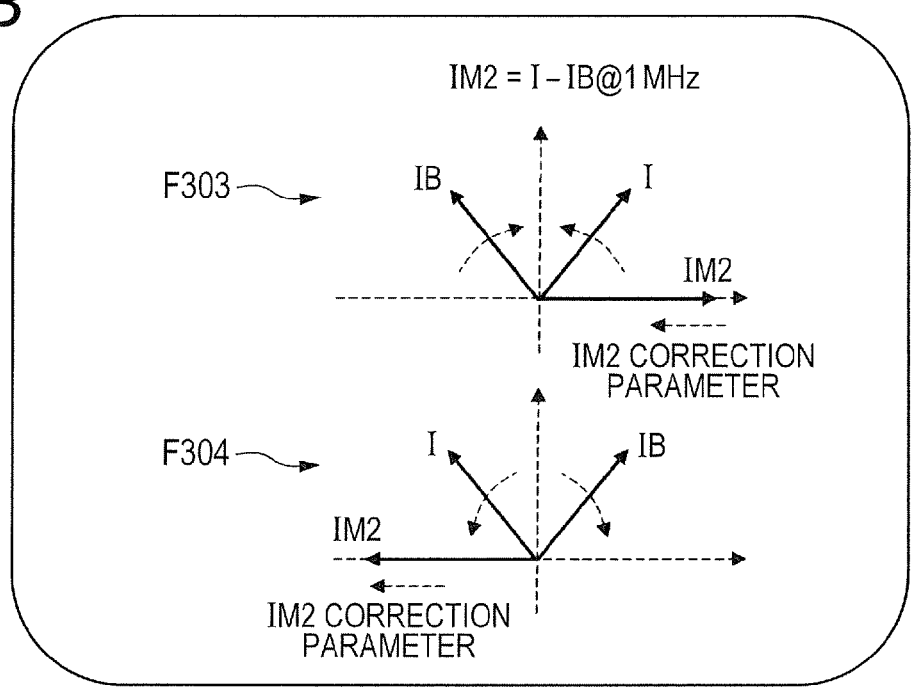
FIG. 3B is a conceptual diagram illustrating an example of characteristic mechanism illustrated in FIG. 3A.

FIG. 3A is an explanatory diagram illustrating an example of IM2 characteristics in the high-frequency signal processor illustrated in FIG. 2. FIG. 3B is a conceptual diagram illustrating an example of characteristic mechanism illustrated in FIG. 3A. FIG. 3A at F301 varies an IM2 correction parameter (e.g., the differential balance for the MIXrx_I in FIG. 2). A specific correction parameter minimizes the IM2 and provides an optimum correction point (an optimum differential balance for the MIXrx_I in FIG. 2). As illustrated in FIG. 3A at F302, the phase drastically reverses 180° at the optimum correction point. The correction circuit block CALBK in FIG. 2 searches for an optimum correction point using the phase characteristic indicated by F302.

FIG. 3B conceptually illustrates IM2 components using vectors. In FIG. 3B, vector I represents an IM2 component the mixer circuit MIXrx_I (or MIXrx_Q) in FIG. 2 generated on the positive terminal side. Vector IB represents an IM2 component the mixer circuit MIXrx_I (or MIXrx_Q) in FIG. 2 generated on the negative terminal side. Initially, vectors I and IB belong to different phases as illustrated in FIG. 3B at F303. As differential output proceeds, resultant IM2 vector IM2 for a first phase occurs and corresponds to vector I-IB. In this state, varying the IM2 correction parameter counterclockwise rotates the phase for vector I and clockwise rotates the phase for vector IB. Vectors I and IB approximate to each other. As a result, the resultant IM2 vector IM2 keeps its phase unchanged and decreases its magnitude.

Vectors I and IB illustrated in FIG. 3B ideally result in I=IB at the optimum correction point illustrated in FIG. 3A. As a result, the resultant IM2 vector IM2 (I-IB) equals to zero. Then, further varying the IM2 correction parameter counterclockwise rotates the phase for vector I and clockwise rotates the phase for vector IB. As a result, vectors I and IB separate from each other as illustrated in FIG. 3B at F304. At this stage, the resultant IM2 vector IM2 (I-IB) has a second phase different from the first phase 180° at F303. As the IM2 correction parameter varies, the resultant IM2 vector IM2 increases its magnitude while maintaining the second phase. This example assumes that vectors I and IB have the same magnitude. Actually, vectors I and IB may have slightly different magnitudes. Also in this case, the phase of the resultant IM2 vector IM2 changes approximately 180° at the optimum correction point.

Details of the Test Signal Generating Circuit and the Correction Circuit Block

Figure 4:
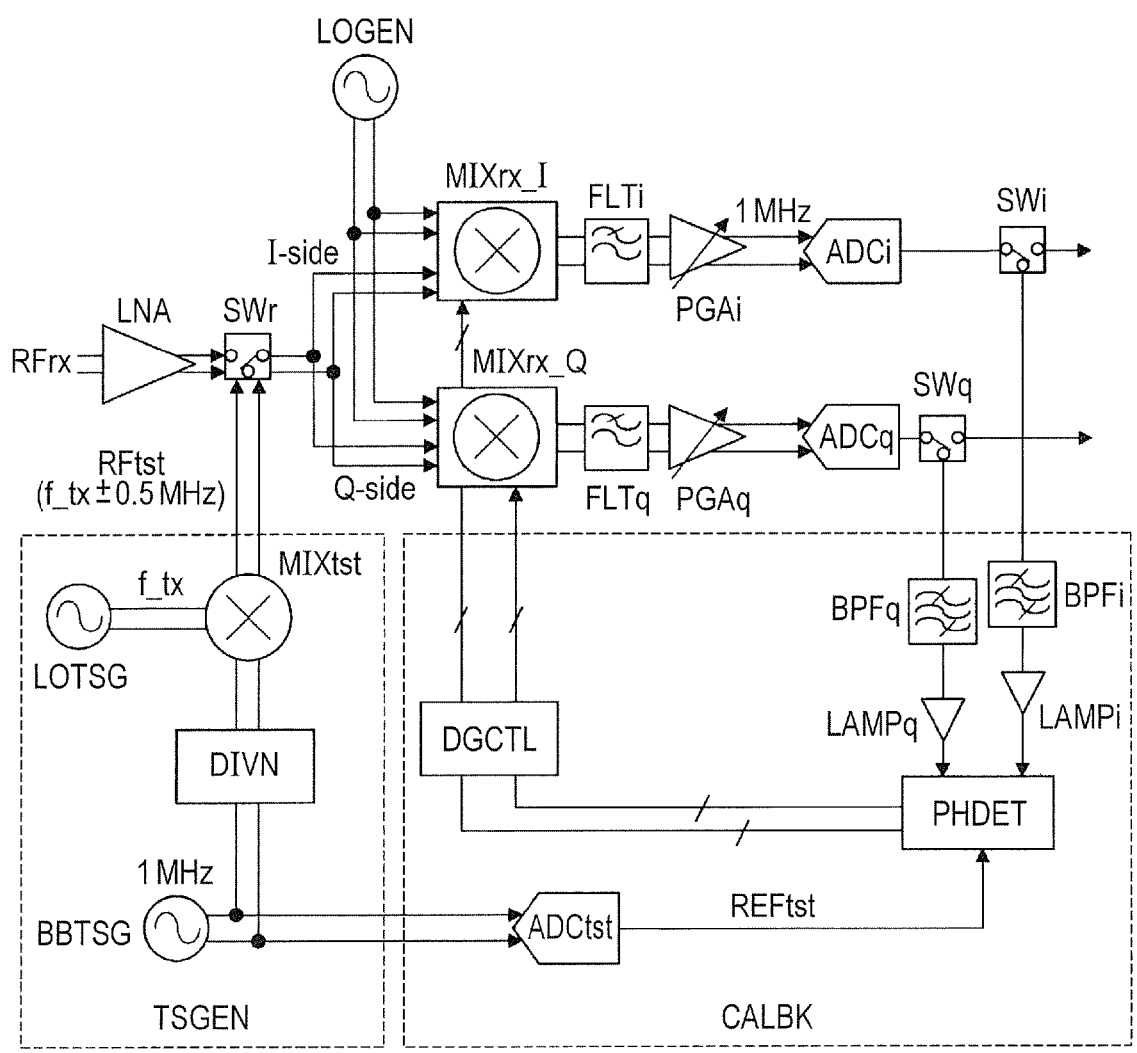
FIG. 4 is a circuit block diagram illustrating a more detailed configuration example of a test signal generating circuit and a correction circuit block in the high-frequency signal processor illustrated in FIG. 2.

FIG. 4 is a circuit block diagram illustrating a more detailed configuration example of a test signal generating circuit and a correction circuit block in the high-frequency signal processor illustrated in FIG. 2. FIG. 4 illustrates a detailed configuration example of the test signal generating circuit TSGEN and the correction circuit block CALBK illustrated in FIG. 2. The LNA, the MIXrx_I, the MIXrx_Q, the LOGEN, the FLTi, the FLTq, the PGAi, and the PGAq are configured to be differential. The ADCi and the ADCq receive differential output signals from the PGAi and the PGAq, respectively, and convert the signals into a single digital signal.

In FIG. 4, the TSGEN includes a test local signal generating circuit LOTSG, a test baseband signal generating circuit BBTSG, a divider circuit DIVN, and a test mixer circuit MIXtst. The LOTSG generates a test carrier signal having a specified frequency f_tx. The frequency f_tx is favorably set to be equal to the frequency of the local signal LOtx for transmission illustrated in FIG. 1. In this case, the LOTSG may be used in common with a local signal generating circuit (not illustrated) for transmission that generates the LOtx. This can prevent a circuit area from increasing.

The BBTSG generates an oscillation signal having a specified frequency (e.g., one MHz) corresponding to the baseband band. The DIVN divides an oscillation signal from the BBTSG by a specified division ratio (e.g., 2). The MIXtst multiplies a carrier signal from the LOTSG by an output signal (e.g., 0.5-MHz oscillation signal) from the DIVN. In other words, a carrier signal from the LOTSG up-converts an output signal from the DIVN. As a result, the MIXtst generates the test signal RFtst having a frequency component of f_tx±0.5 MHz. In this example, the LOTSG, the BBTSG, the DIVN, and the MIXtst are configured to be differential.

As illustrated in FIG. 2, the RFtst is input to the mixer circuits MIXrx_I and MIXrx_Q via the switch SWr. The ADCi and the ADCq convert output signals from the MIXrx_I and the MIXrx_Q into digital signals. Digital signals from the ADCi and the ADCq are input to the correction circuit block CALBK via switches SWi and SWq, respectively. The CALBK includes bandpass filters BPFi and BPFq, amplifier circuits LAMPi and LAMPq, a phase detection circuit PHDET, a digital correction circuit DGCTL, and an analog-digital converter circuit ADCtst. The DGCTL provides a logical operation circuit that performs digital processing. The DGCTL can represent but is not limited to a state machine or a small-scale processor, for example.

The BPFi extracts an IM2 component (e.g., 1-MHz component) from the digital signal supplied from the ADCi via the SWi while the IM2 component is generated from the MIXrx_I. The BPFq extracts an IM2 component (e.g., 1-MHz component) from the digital signal supplied from the ADCq via the SWq while the IM2 component is generated from the MIXrx_Q. The LAMPi amplifies an output signal from the BPFi to a sufficient level. The LAMPq amplifies an output signal from the BPFq to a sufficient level. In this example, the BPFi and the BPFq provide digital filters. The LAMPi and the LAMPq provide digital amplifiers. The ADCtst converts an oscillation signal (e.g., one MHz) from the BBTSG into a digital signal. The ADCtst generates a test reference oscillation signal REFtst as a digital signal.

The PHDET detects a phase for the output signal from the LAMPi and a phase for the output signal from the LAMPq with reference to the phase for the REFtst (e.g., one MHz). The DGCTL changes the differential balance for the MIXrx_I according to a phase detection result for the LAMPi from the PHDET. The DGCTL changes the differential balance for the MIXrx_Q according to a phase detection result for the LAMPq from the PHDET. Specifically, the DGCTL sets a differential balance (assumed to be setting [1]) for the MIXrx_I. The DGCTL acquires a phase detection result (assumed to be result [1]) for the LAMPi, namely, a phase difference between the phase for the LAMPi and the phase for the REFtst. The DGCTL then appropriately changes the differential balance (assumed to be setting [2]) for the MIXrx_I. The DGCTL acquires a phase detection result (assumed to be result [2]) for the LAMPi, namely, a phase difference between the phase for the LAMPi and the phase for the REFtst.

The DGCTL finds a phase difference between the above-mentioned results [1] and [2]. In FIG. 3A at F302, suppose that a minimum fluctuation range results from the differential balance (IM2 correction parameter) between the above-mentioned results [1] and [2]. If the phase difference between the results [1] and [2] is approximately 180°, the setting [1] or [2] provides the optimum correction point. If the phase difference between the results [1] and [2] is approximately 0°, the DGCTL assumes that another differential balance may contain the optimum correction point. The DGCTL then changes the differential balance. The DGCTL repeats this process to search for the optimum correction point for the MIXrx_I. After acquiring the optimum correction point for the MIXrx_I, the DGCTL similarly searches for the optimum correction point for the MIXrx_Q.

There has been described a phase difference of approximately 180° or 0° between the differential balance (IM2 correction parameter) and the minimum fluctuation range. Actually, however, some errors may occur. If the minimum fluctuation range is very small, for example, the optimum correction point may cause a phase difference somewhat smaller than approximately 180°. The DGCTL can actually use 90° as a determination threshold value, though not limited thereto. The DGCTL determines that the optimum correction point is available if the phase difference from the minimum fluctuation range is larger than or equal to 90°. The DGCTL determines that another differential balance may contain the optimum correction point if the phase difference is smaller than 90°. The invention is not limited to this technique. For example, a possible technique may use more than one determination threshold value and search for a position corresponding to the largest phase difference. Whichever technique is used, the phase difference from the minimum fluctuation range obviously decreases (ideally 0°) if the differential balance deviates from the optimum correction point. This characteristic can be used to estimate the optimum correction point early. The phase difference obviously increases (ideally 180°) at the optimum correction point. This characteristic can be used to estimate the optimum correction point highly accurately.

As illustrated in FIGS. 4 and 2, input to the CALBK follows the ADCi and the ADCq. The invention is not limited thereto. Input to the CALBK just needs to follow the MIXrx_I and the MIXrx_Q. For example, output from the PGAi and the PGAq may be input to the CALBK. After the ADCi and the ADCq, the CALBK performs digital processing for amplification and phase detection. After the PGAi and the PGAq, the CALBK performs analog processing for amplification and phase detection. As described above, however, the CALBK compares the phase (result [2]) at a given time point with the phase (result [1]) at another time point. The digital processing is considered more appropriate than the analog processing. Input to the CALBK favorably follows the ADCi and the ADCq from the viewpoint of a noise that may result from the switches SWi and SWq. The SWr may be positioned before the MIXrx_I and the MIXrx_Q and favorably after the LNA from the viewpoint of a noise or a noise figure (NF).

Details of the Reception Mixer Circuit

Figure 5:
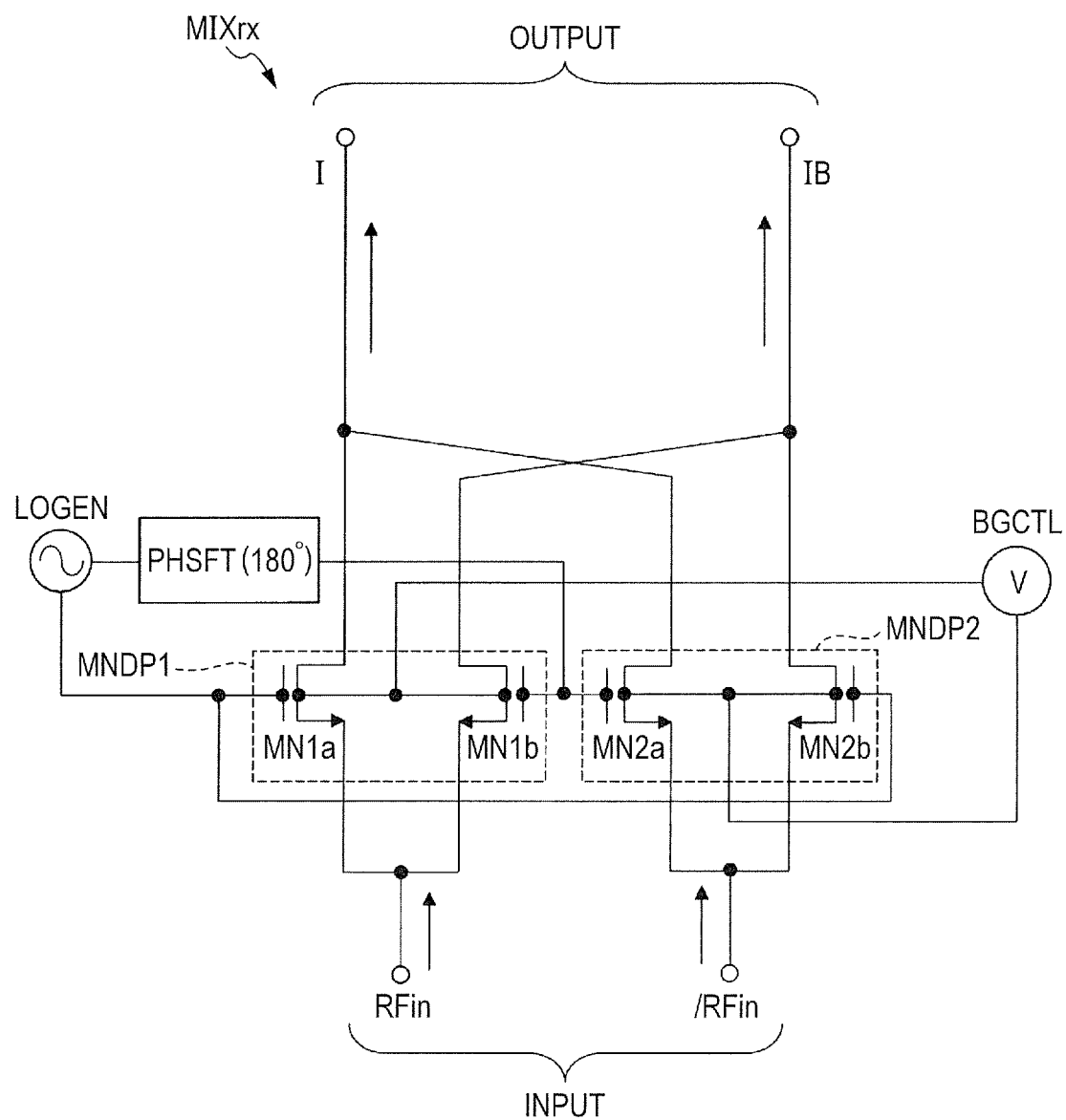
FIG. 5 is a circuit diagram illustrating a configuration example of a reception mixer circuit in the high-frequency signal processor illustrated in FIG. 2.

FIG. 5 is a circuit diagram illustrating a configuration example of a reception mixer circuit in the high-frequency signal processor illustrated in FIG. 2. A mixer circuit MIXrx illustrated in FIG. 5 is equivalent to each of the MIXrx_I and the MIXrx_Q illustrated in FIG. 2. The MIXrx includes two pairs of differential pair transistors MNDP1 and MNDP2, a phase shift circuit PHSFT, and a back gate (substrate potential) control circuit BGCTL. FIG. 5 also illustrates the local signal generating circuit LOGEN illustrated in FIG. 2. The PHSFT generates a signal by adding a specified phase difference (e.g., 180°) to the local signal from the LOGEN. The MNDP1 includes two NMOS transistors MN1a and MN1b whose sources are coupled to each other in common. The source is supplied with a high-frequency signal RFin from the positive terminal. The MNDP2 includes two NMOS transistors MN2a and MN2b whose sources are coupled to each other in common. The source is supplied with a high-frequency signal (/RFin) from the negative terminal. The RFin and the /RFin are equivalent to output signals from the SWr in FIG. 2.

The gates of the MN1a and the MN2b are supplied with a local signal from the LOGEN. The gates of the MN1b and the MN2a are supplied with a local signal from the LOGEN via the PHSFT. The drain of the MN1a is coupled to the drain of the MN2a in common. The drain generates an output signal (current signal) I at the positive terminal. The drain of the MN1b is coupled to the drain of the MN2b in common. The drain generates an output signal (current signal) IB at the negative terminal. The BGCTL appropriately controls back bias (substrate potential) for the MN1a, the MN1b, the MN2a, and the MN2b. The MIXrx in FIG. 5 is referred to as a passive double-balanced mixer (DBM). The MIXrx_I and the MIXrx_Q illustrated in FIG. 2 are not limited to the configuration illustrated in FIG. 5 and may use an active DBM such as the Gilbert cell or a single-balanced mixer according to circumstances. However, the configuration in FIG. 5 is favorable from the viewpoint of power consumption, linearity, and high speed.

Figure 6:
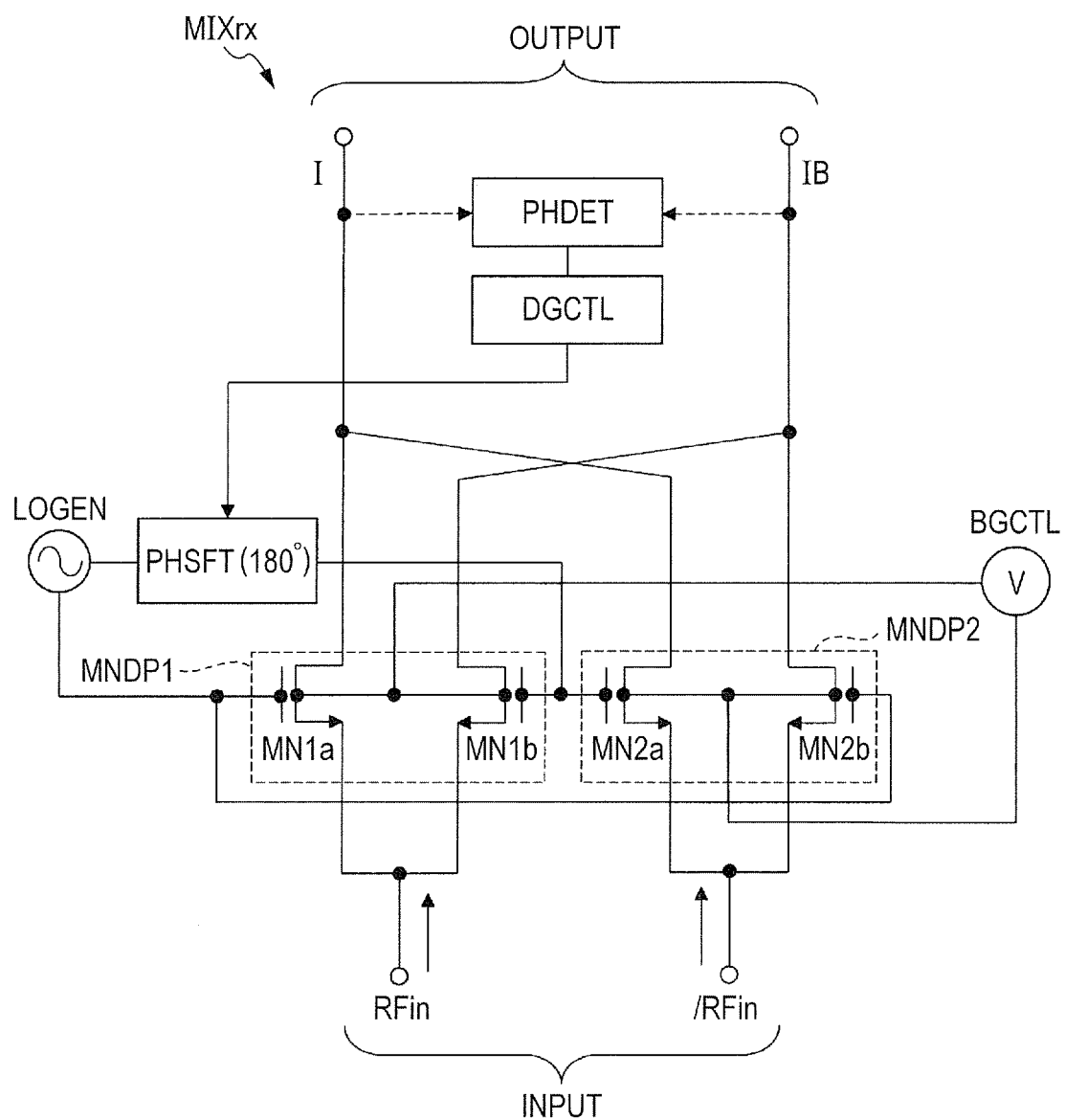
FIG. 6 is a conceptual diagram illustrating an example method for adjusting differential balance (IM2 correction parameter) in the mixer circuit illustrated in FIG. 5.
Figure 7:
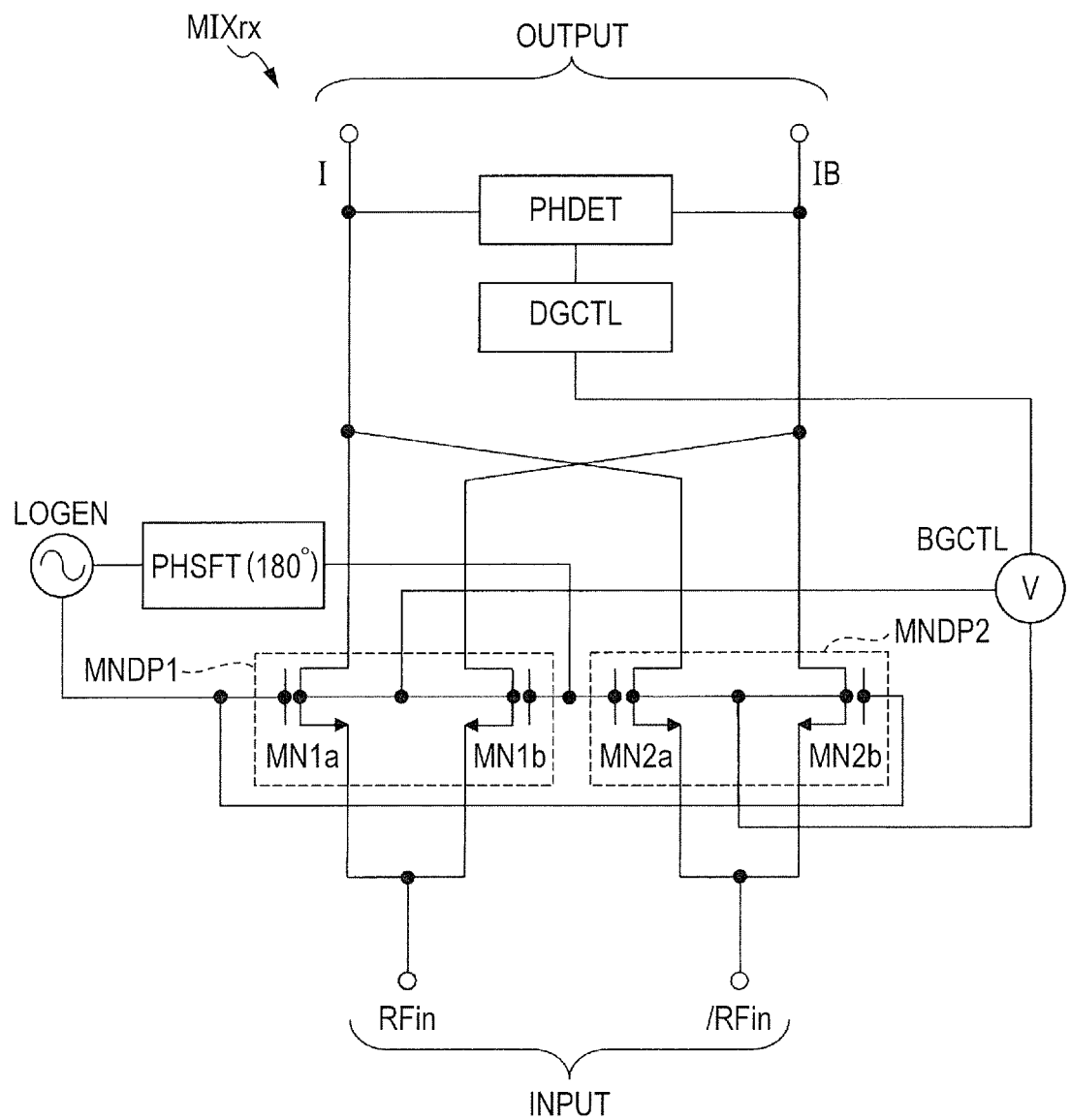
FIG. 7 is a conceptual diagram illustrating another example method for adjusting differential balance (IM2 correction parameter) in the mixer circuit illustrated in FIG. 5.
Figure 8:
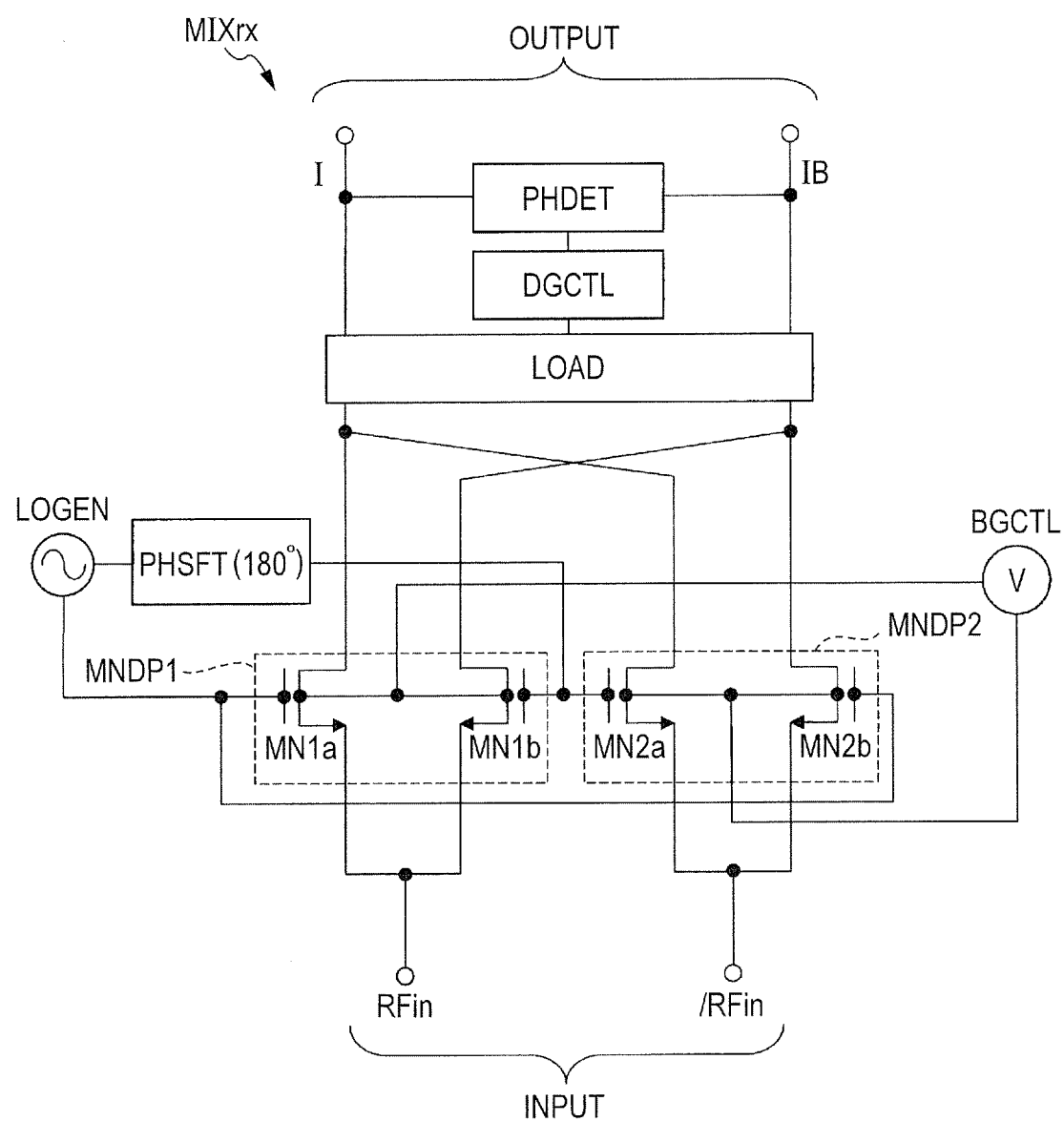
FIG. 8 is a conceptual diagram illustrating still another example method for adjusting differential balance (IM2 correction parameter) in the mixer circuit illustrated in FIG. 5.

FIGS. 6 through 8 are conceptual diagrams illustrating different example methods for adjusting the differential balance (IM2 correction parameter) in the mixer circuit illustrated in FIG. 5. FIGS. 6 through 8 conceptually illustrate relationships among the configuration example FIG. 5, the phase detection circuit PHDET, and the digital correction circuit DGCTL. As illustrated in FIGS. 6 through 8, the differential output signal (I or IB) from the mixer circuit MIXrx contains the resultant IM2 vector that results from a vector difference (I-IB) between the IM2 component of the signal I and the IM2 component of the signal IB. The PHDET detects the phase for the resultant IM2 vector. The DGCTL monitors a result of the PHDET that detects the phase for the resultant IM2 vector. The DGCTL appropriately changes the differential balance (IM2 correction parameter) while determining whether the phase is reversed.

According to the example in FIG. 6, the DGCTL changes the differential balance (IM2 correction parameter) in the phase shift circuit PHSFT. For example, the DGCTL allows the PHSFT to vary the phase shift amount in the range of approximately 180°. The DGCTL thereby changes the differential balance between the MN1a and the MN1b the differential balance between the MN2a and the MN2b. According to an example in FIG. 7, the DGCTL allows the back gate control circuit BGCTL to change the differential balance. For example, the DGCTL allows the BGCTL to control the back gates of the transistors MN1a, MN1b, MN2a, and MN2b to change threshold voltages for these transistors. The BGCTL thereby changes the differential balance.

According to an example in FIG. 8, the DGCTL allows a load circuit LOAD to change the differential balance. As illustrated in FIG. 8, the mixer circuit MIXrx is actually provided with a load (e.g., a resistor element) that converts the output signals (current signals) I and IB into voltage signals. The DGCTL changes the differential balance by changing the relative balance between the I-side load magnitude and the IB-side load magnitude. As illustrated in FIGS. 6 through 8, various techniques can be used to change the differential balance for the MIXrx. The embodiment is not limited to the techniques of changing the differential balance and just needs to select the technique according to the mixer circuit scheme. If the passive double-balanced mixer as illustrated in FIG. 5 is used, for example, the embodiment can use any one of or a combination of the techniques illustrated in FIGS. 6 through 8. If the active double-balanced mixer is used, for example, the embodiment may use a technique of changing the bias current balance for each of the differential pair transistors.

Searching for an Optimum Correction Point (Binary Search)

Figure 9:
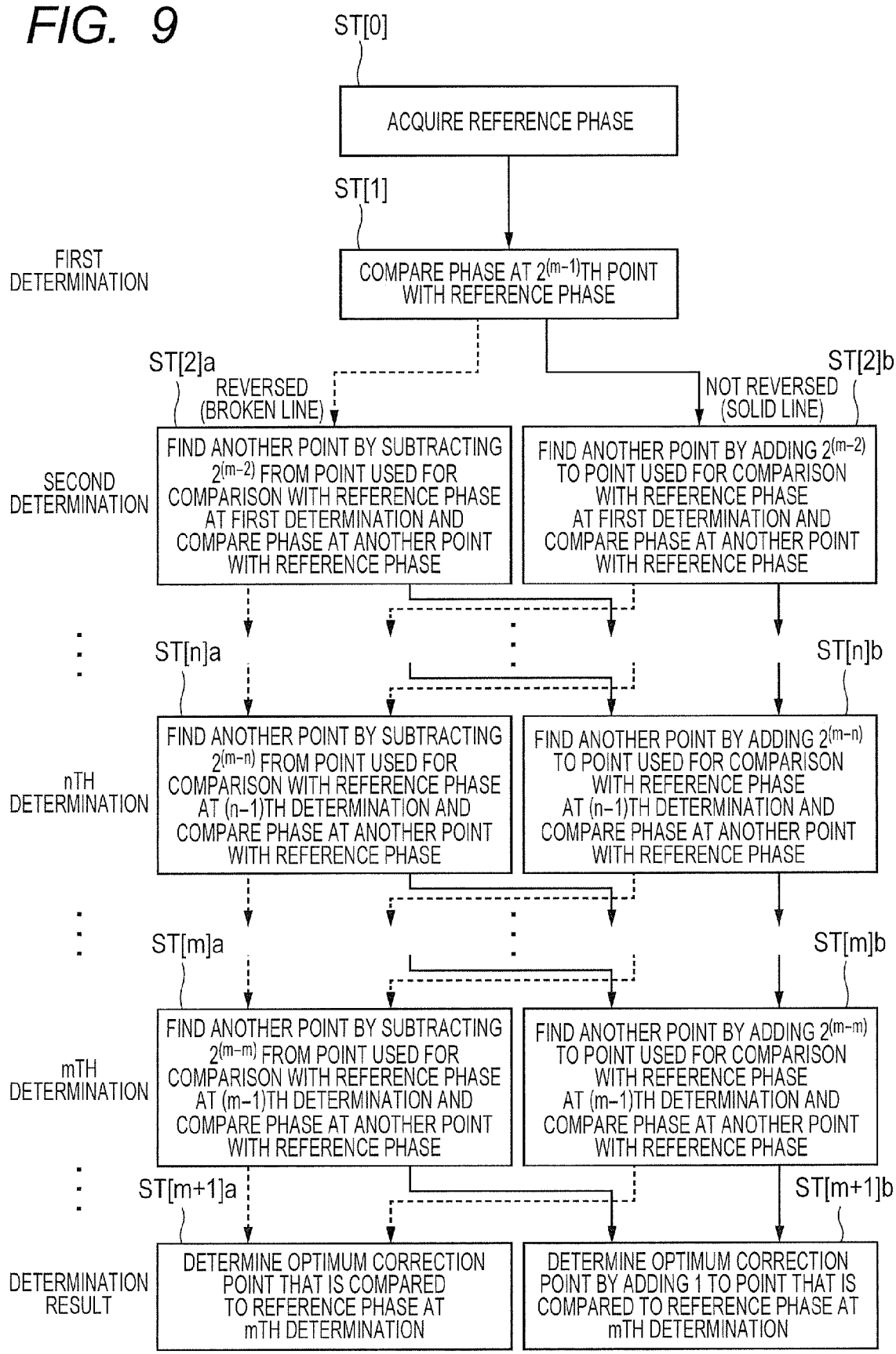
FIG. 9 is a flowchart illustrating an example method for the correction circuit block in the high-frequency signal processor illustrated in FIG. 2 to search for an optimum correction point.
Figure 10:
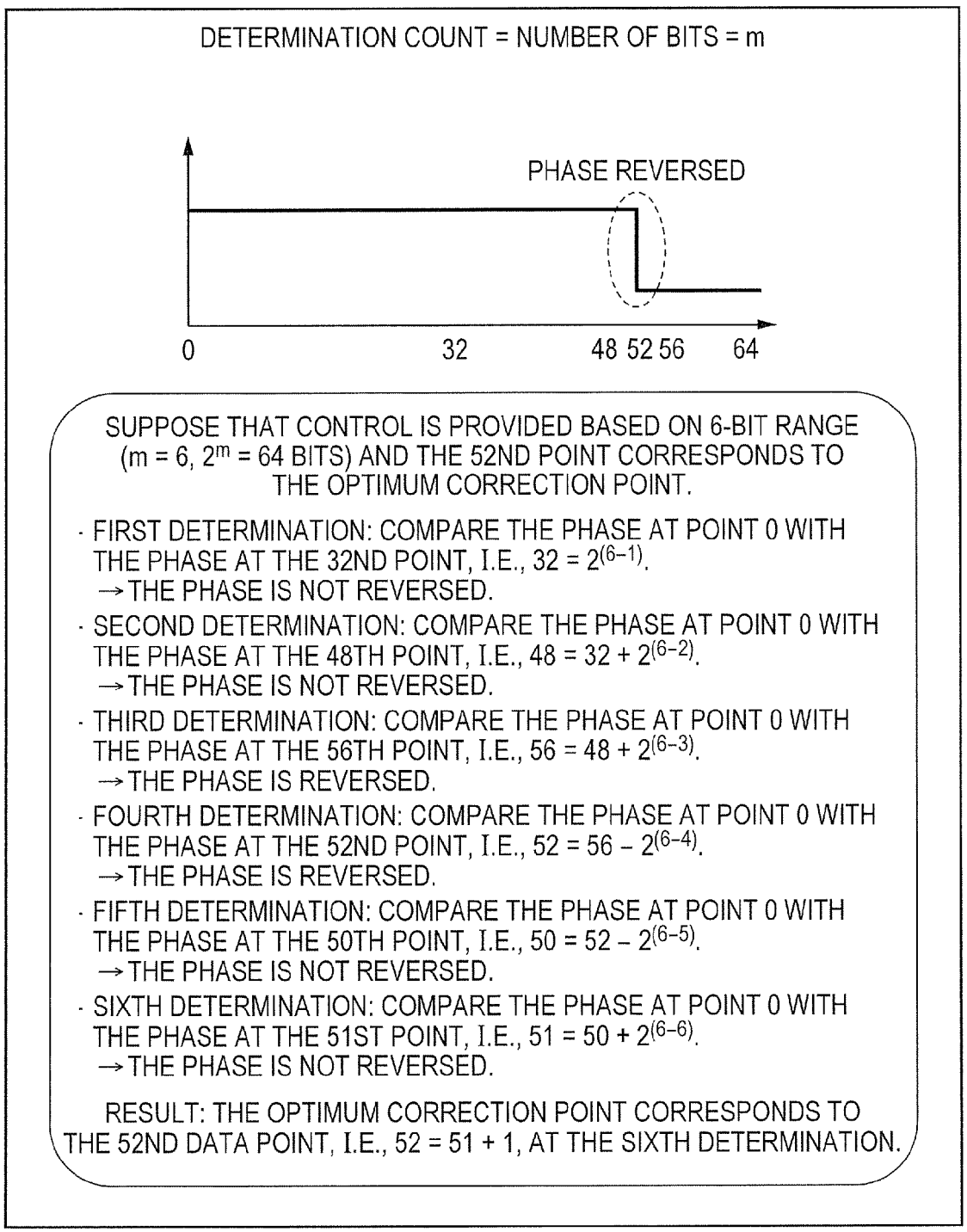
FIG. 10 supplements an example of actual operation according to the flowchart illustrated in FIG. 9.

FIG. 9 is a flowchart illustrating an example method for the correction circuit block in the high-frequency signal processor illustrated in FIG. 2 to search for an optimum correction point. FIG. 10 supplements an example of actual operation according to the flowchart illustrated in FIG. 9. As described above, the correction circuit block CALBK (e.g., the digital correction circuit DGCTL) illustrated in FIG. 2 searches for an optimum correction point using the characteristic that the phase for the resultant IM2 vector transitions approximately 180° at the optimum correction point. The CALBK can therefore perform the binary search as illustrated in FIGS. 9 and 10.

FIG. 9 assumes m-bit wide control (a variable range of $2^m$ bits) of the IM2 correction parameter. The correction circuit block CALBK acquires a reference phase (ST[0]). The reference phase just needs to correspond to one of both ends of the variable range. In this example, the reference phase corresponds to the zeroth point as a determination point. The CALBK sets the IM2 correction parameter to point $2^{(m-1)}$, namely, a middle point in the variable range. As the first determination, the CALBK compares the phase at the determination point ($2^{(m-1)}$) with the reference phase (ST[1]). If the phase reverses (e.g., transition of approximately 180°) as a comparison result at ST[1], the CALBK proceeds to ST[2]a and performs the second determination. If the phase does not reverse (e.g., transition of approximately 0°), the CALBK proceeds to ST[2]b and performs the second determination. As described above, the CALBK just needs to determine whether the phase reverses by checking if a phase difference from the reference phase is larger than or equal to 90° or smaller than 90°, though not limited thereto.

At ST[2]a, the CALBK sets the IM2 correction parameter to a determination point $2^{(m-1)}-2^{(m-2)}$, found by subtracting $2^{(m-2)}$ from the first determination point, and compares the phase at the determination point with the reference phase. At ST[2]b, the CALBK sets the IM2 correction parameter to a determination point $2^{(m-1)}+2^{(m-2)}$, found by adding $2^{(m-2)}$ to the first determination point, and compares the phase at the determination point with the reference phase. If the phase reverses as a result of the first determination, the phase transition point exits between the first point and point $2^{(m-1)}$. At ST[2]a, the CALBK verifies the phase at the middle point. If the phase does not reverse, the phase transition point exits between point $2^{(m-1)}$ and point $2^m$. At ST[2]b, the CALBK verifies the phase at the middle point.

If the phase reverses at ST[2]a or ST[2]b, the CALBK similarly proceeds to ST[3]a (not illustrated) and performs the third determination. If the phase does not reverse, the CALBK similarly proceeds to ST[3]b (not illustrated) and performs the third determination. Similar processes follow. The nth determination includes ST[n]a and ST[n]b. At ST[n]a, the CALBK compares the reference phase with the phase at a determination point found by subtracting $2^{(m-1)}$ from the (n−1)th determination point. At ST[n]b, the CALBK compares the reference phase with the phase at a determination point found by adding $2^{(m-1)}$ to the (n−1)th determination point. If the phase reverses at ST[n]a or ST[n]b, the CALBK proceeds to ST[n+1]a (not illustrated) and performs the (n+1)th determination. If the phase does not reverse, the CALBK proceeds to ST[n]b (not illustrated) and performs the (n+1)th determination.

Finally, the mth determination includes ST[m]a and ST[m]b. At ST[m]a, the CALBK compares the reference phase with the phase at a determination point found by subtracting $2^{(m-m)}$ from the (m−1)th determination point. At ST[m]b, the CALBK compares the reference phase with the phase at a determination point found by adding $2^{(m-m)}$ to the (m−1)th determination point. If the phase reverses at ST[m]a or ST[m]b, the CALBK proceeds to ST[m+1]a. If the phase does not reverse, the CALBK proceeds to ST[m+1]b. At ST[m+1]a, the CALBK registers the optimum correction point corresponding to the determination point at the mth determination. At ST[m+1]b, the CALBK registers the optimum correction point corresponding to a point found by adding 1 to the determination point at the mth determination.

An example in FIG. 10 assumes that the IM2 correction parameter is applicable to a variable range of m=6 ($2^m$=64 points) and that the 52nd point corresponds to the optimum correction point. At the first determination, the reference phase (phase at the zeroth point) is reverse to the phase at the 32nd point. The CALBK determines that the optimum correction point exists between the 32nd point and the 64th point. The CALBK performs the second determination, assuming the 48th point as the middle point to be a determination point. At the second determination, the reference phase is not reverse to the phase at the 48th point. The CALBK determines that the optimum correction point exists between the 48th point and the 64th point. The CALBK performs the third determination, assuming the 56th point as the middle point to be a determination point.

At the third determination, the reference phase is reverse to the phase at the 56th point. The CALBK determines that the optimum correction point exists between the 48th point and the 56th point. The CALBK performs the fourth determination, assuming the 52nd point as the middle point to be a determination point. At the fourth determination, the reference phase is reverse to the phase at the 52nd point. The CALBK determines that the optimum correction point exists between the 48th point and the 52nd point. The CALBK performs the fifth determination, assuming the 50th point as the middle point to be a determination point. At the fifth determination, the reference phase is not reverse to the phase at the 50th point. The CALBK determines that the optimum correction point exists between the 50th point and the 52nd point. The CALBK performs the sixth determination, assuming the 51st point as the middle point to be a determination point. At the sixth determination, the reference phase is not reverse to the phase at the 51st point. As a result, the CALBK determines the 52nd point to be the optimum correction point.

According to the flowchart illustrated in FIG. 9, the CALBK divides the variable range of $2^m$ bits for the IM2 correction parameter in half. The CALBK then determines which part of the range contains the optimum correction point (phase transition point). The CALBK further divides the range containing the optimum correction point in half and determines which part of the range contains the optimum correction point. This process is performed m times. The determination process, when performed m times, narrows the range for the 1-bit optimum correction point. The binary search just needs to perform the determination process m times for the search range of $2^m$ bits. The optimum correction point can be found in a short search time.

As a comparison, consider a case of searching for the optimum correction point using the amplitude level detection as illustrated in FIG. 3A at F301. In this case, it is difficult to use the binary search. For example, the following search technique needs to be used. Suppose the variable range is 64 bits. For example, the search technique divides the range by eight bits to yield eight determination points. The search technique compares IM2 amplitude levels at the determination points to search for a determination point corresponding to the smallest amplitude. The search technique sweeps a range of ±4 bits one bit by one at the determination point to search for the minimum point for the amplitude. This search technique requires 16 determination processes in total. By contrast, the search technique illustrated in FIG. 9 requires only six determination processes in total.

The high-frequency signal processor and the wireless communication system according to the first embodiment of the invention can typically allow the correction circuit block to perform a correction process and reduce the secondary intermodulation distortion that may occur in the reception circuit. The correction circuit block detects the phase transition point of an IM2 vector to search for the optimum correction point. This enables to facilitate the search operation, increase the search accuracy, and shorten the search time.

Second Embodiment

Figure 11A:
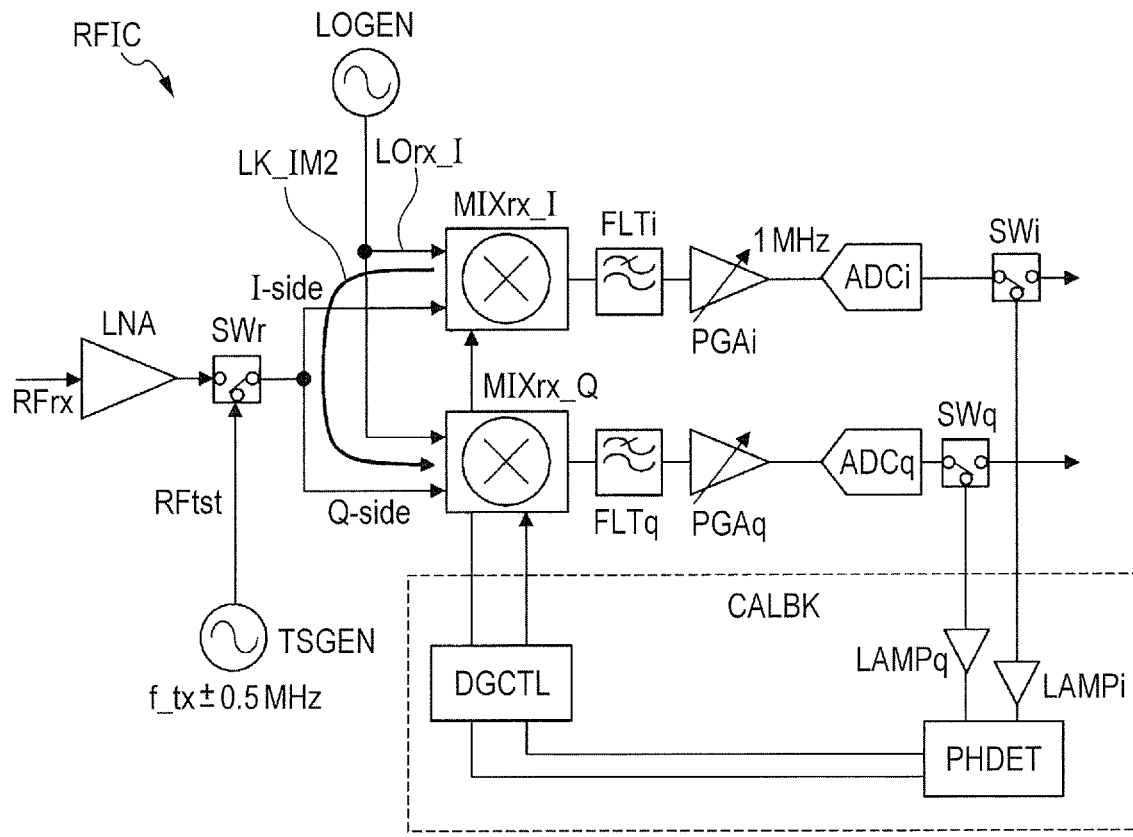
FIGS. 11A and 11B illustrate an example problem in a high-frequency signal processor according to a second embodiment of the invention.
Figure 11B:
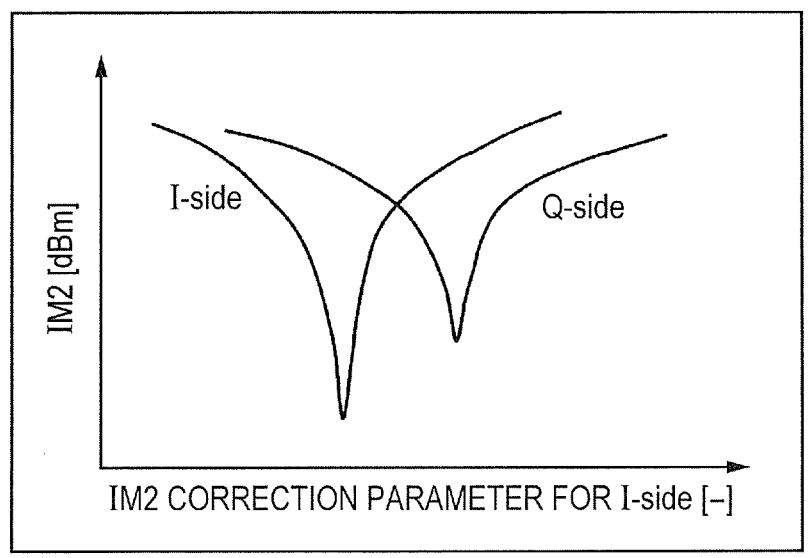

FIGS. 11A and 11B illustrate an example problem in a high-frequency signal processor according to a second embodiment of the invention. FIG. 11A illustrates a high-frequency signal processor RFIC having the configuration similar to that illustrated in FIG. 2. The first embodiment provides the example that independently corrects the I-side (mixer circuit MIXrx_I) and the Q-side (mixer circuit MIXrx_Q) in FIG. 11A. Actually, however, the MIXrx_I and the MIXrx_Q may operate simultaneously. As illustrated in FIG. 11A, an IQ interference may occur due to a leak signal LK_IM2 containing an IM2 component between the MIXrx_I and the MIXrx_Q.

If the IM2 correction parameter is varied for the I-side (MIXrx_I), the optimum correction point occurs on the Q-side (MIXrx_Q) as well as the I-side as illustrated in FIG. 11B. This situation may occur even if the I-side and the Q-side are reversed. For example, an IM2 component resulting from the MIXrx_I leaks to the MIXrx_Q and is superposed on an IM2 component resulting from the MIXrx_Q. This situation may occur even if the I-side and the Q-side are reversed. If the IQ interference occurs, a correction parameter for the I-side affects the Q-side and a correction parameter for the Q-side affects the I-side. Just correcting the I-side and the Q-side independently may not provide the optimum correction point for actual operation. The search time may increase if the I-side correction and the Q-side correction are alternately repeated in consideration of the IQ interference. To solve this problem, the second embodiment provides a technique of searching for the optimum correction point in consideration of influence of the IQ interference.

FIG. 12 is an explanatory diagram illustrating an example method for the high-frequency signal processor according to the second embodiment of the invention to search for an optimum correction point. At S1201, the correction circuit block CALBK in FIG. 11A varies an IM2 correction parameter (Pi) for the I-side and searches for an optimum correction point (Ii) that minimizes the value of an IM2 component (IM2_I) for the I-side. The IQ interference changes an IM2 component (IM2_Q) for the Q-side and yields a point (Qi) that minimizes the IM2 Q. The CALBK searches for Qi as well as Ii. At S1201, an IM2 correction parameter (Pq) for the Q-side is unchanged and is fixed to the default (0).

At S1202, the CALBK varies an IM2 correction parameter (Pq) for the Q-side and searches for an optimum correction point (Qq) that minimizes the value of an IM2 component (IM2_Q) for the Q-side. The IQ interference changes an IM2 component (IM2_I) for the I-side and yields a point (Iq) that minimizes the IM2_I. The CALBK searches for Iq as well as Qq. At S1202, an IM2 correction parameter (Pi) for the I-side is unchanged and is fixed to the default (0). FIG. 12 illustrates the IM2_I and the IM2_Q using amplitude levels for convenience sake. An actual search method uses the phase information as described in the first embodiment.

Finally, at S1203, the CALBK uses Ii, Qi, Iq, and Qq found at S1201 and S1202 to perform equations (1) and (2) as follows. Equation (1) calculates an optimum correction point Ical for the I-side in consideration of the IQ interference. Equation (2) calculates an optimum correction point Qcal for the Q-side in consideration of the IQ interference.

$$Ical = Ii \cdot Qi \cdot (Iq - Qq)/(Iq \cdot Qi - Ii \cdot Qq) \tag{1}$$

$$Qcal = Qq \cdot Iq \cdot (Qi - Ii)/(Qi \cdot Iq - Qq \cdot Ii) \tag{2}$$

Figure 13A:
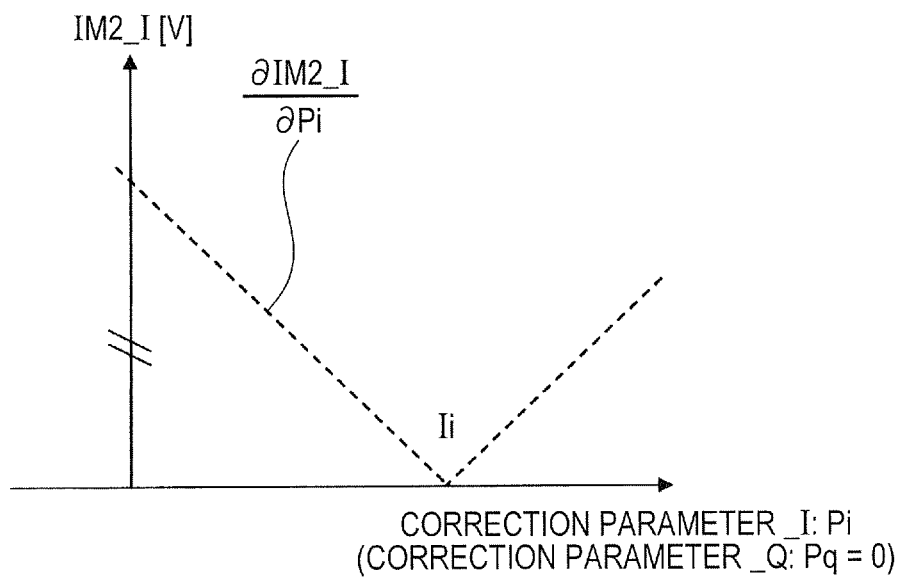
FIGS. 13A and 13B supplement FIG. 12.
Figure 13B:
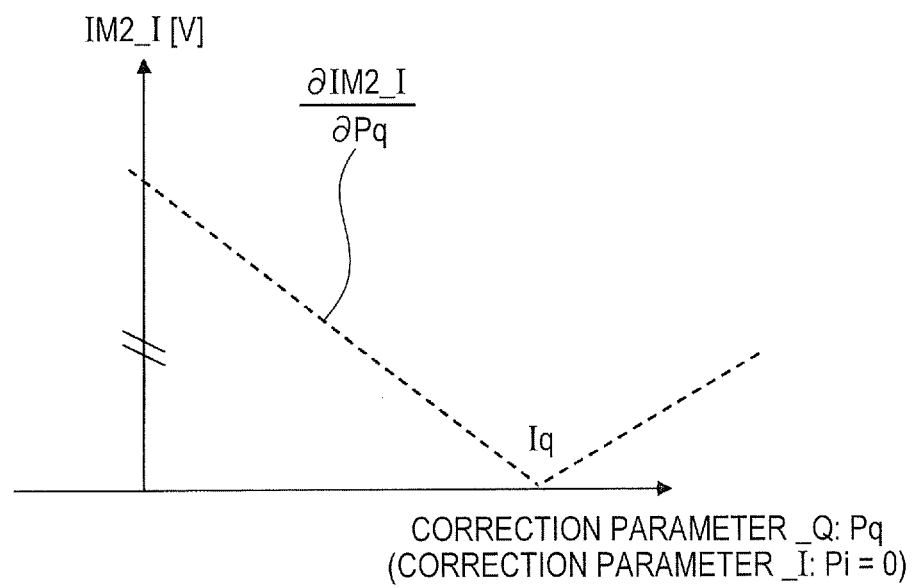

Equations (1) and (2) are derived as follows. FIGS. 13A and 13B supplement FIG. 12. As illustrated in FIGS. 13A and 13B, the vertical axis represents IM2_I [V]. The horizontal axis represents the IM2 correction parameter (Pi) (FIG. 13A) for the I-side and the IM2 correction parameter (Pq) (FIG. 13B) for the Q-side. The dependence between them is assumed linear. The Ical represents a Pi value corresponding to the minimum IM2_I and the Qcal represents a Pq value corresponding to the minimum IM2_Q after considering the IQ interference. The Ical and the Qcal are assumed to have the relationship expressed in equation (3) below.

$$Ical = Ii - \frac{\partial Pi}{\partial Pq} Qcal \tag{3}$$

Equation (4) derives from the geometric relationship between FIGS. 13A and 13B. Reflecting equation (4) on equation (3) derives equation (5). Equation (6) is similarly derived for the Q-side. Equations (5) and (6) are solved as simultaneous equations to derive equations (1) and (2) described above.

$$\frac{\partial IM2\_I}{\partial Pq} : \frac{\partial IM2\_I}{\partial Pi} = Ii : Iq \tag{4}$$

$$Ical = Ii - \frac{\partial Pi}{\partial IM2\_I} \cdot \frac{\partial IM2\_I}{\partial Pq} Qcal = Ii - \frac{Ii}{Iq} \cdot Qcal \tag{5}$$

$$Qcal = Qq - \frac{Qq}{Qi} \cdot Ical \tag{6}$$

The high-frequency signal processor according to the second embodiment can search for the optimum correction point more highly accurately in consideration of the influence of the IQ interference in addition to various effects described in the first embodiment. Particularly, the point Qi or Iq in FIG. 12 may decrease the amplitude level. The point Qi or Iq may be detected with difficulty at the amplitude level. However, the embodiment detects these points using phases. The amplifier circuits LAMPi and LAMPq in FIG. 11A can sufficiently amplify the points and easily and highly accurately detect the points. The search time can be shortened because the search for Ii, Qi, Iq, and Qq just requires 24 determination processes according to the example in FIG. 10 (m=6). By contrast, more than 24 determination processes may be required until the final detection if the correction of the I-side and the Q-side is alternately repeated several times in consideration of the IQ interference.

Third Embodiment

Figure 14:
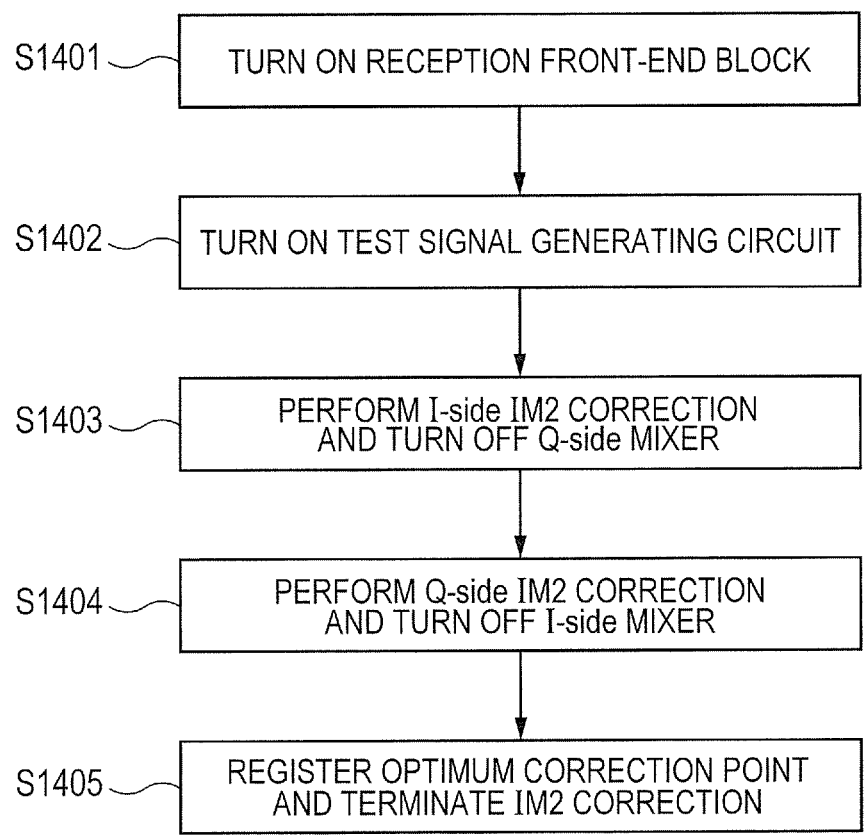
FIG. 14 is a flowchart illustrating an example method for a high-frequency signal processor according to a third embodiment of the invention to search for an optimum correction point.

The third embodiment describes an optimum correction point search technique different from the second embodiment. FIG. 14 is a flowchart illustrating an example method for a high-frequency signal processor according to the third embodiment of the invention to search for an optimum correction point. The high-frequency signal processor according to the third embodiment is configured similarly to the high-frequency signal processor RFIC as illustrated in FIGS. 2 and 4. At S1401 in FIG. 14, the high-frequency signal processor RFIC turns on or activates the reception frontend block (the reception circuits in FIG. 1 such as LNA, MIXrx, and BE or the circuits in FIG. 2 other than TSGEN). At S1402, the RFIC then turns on or activates the test signal generating circuit (TSGEN in FIGS. 2 and 4).

At S1403, the RFIC (e.g., the correction circuit block CALBK) turns off or inactivates the Q-side mixer circuit (MIXrx_Q in FIGS. 2 and 4). In this state, the RFIC corrects the I-side IM2 or searches for the IM2 correction parameter for the MIXrx_I in FIGS. 2 and 4 using the test signal generating circuit TSGEN and the CALBK. At S1404, the RFIC (e.g., the CALBK) turns off the I-side mixer circuit (the MIXrx_I in FIGS. 2 and 4) and turns on the Q-side mixer circuit. In this state, the RFIC corrects the Q-side IM2 or searches for the IM2 correction parameter for the MIXrx_Q in FIGS. 2 and 4 using the TSGEN and the CALBK. The mixer circuit is turned off or inactivated if input of the local signal, LOrx_I or LOrx_Q, stops or the buffer circuit to output LOrx_I or LOrx_Q stops, for example. However, the invention is not limited thereto.

The IM2 correction parameters for the MIXrx_I and the MIXrx_Q are searched at S1403 and S1404. At S1405, the RFIC registers these IM2 correction parameters to the MIXrx_I and the MIXrx_Q and completes the IM2 correction. This search method can correct the IM2 easily and fast without being influenced by the IQ interference. Compared to the technique according to the second embodiment, the technique according to the third embodiment may cause an error at the optimum correction point if the MIXrx_I and the MIXrx_Q operate simultaneously. In this case, the technique according to the second embodiment is more favorable. However, the technique according to the second embodiment may cause Qi or Iq in FIG. 12 to exceed the variable range of IM2. In this case, the technique according to the third embodiment is more favorable.

While there have been described specific preferred embodiments of the present invention, it is to be distinctly understood that the present invention is not limited thereto but may be otherwise variously embodied within the spirit and scope of the invention.

Particularly, the high-frequency signal processor and the wireless communication system according to the embodiment are beneficially applicable to a high-frequency signal processor having direct conversion reception circuit and performing FDD-based transmission and reception and applicable to a mobile telephone having the high-frequency signal processor. In addition, the high-frequency signal processor and the wireless communication system according to the embodiment are applicable to a high-frequency signal processor performing TDD-based transmission and reception and applicable to various wireless communication systems such as wireless LAN (Local Area Network) and Bluetooth (registered trademark).

What is claimed is:

1. A high-frequency signal processor provided with a first operation mode and a second operation mode, the high-frequency signal processor comprising:
a test signal generating circuit that generates a test signal having a first frequency component and a second frequency component;
a first switch that transmits a signal received as a first signal at an antenna in the first operation mode and transmits the test signal as the first signal in the second operation mode;
a mixer circuit that includes a differential circuit capable of correcting a differential balance within a specified variable range and down-converts the first signal to a second signal having a frequency band lower than the first signal;
a phase detection portion that extracts a third signal from the second signal in the second operation mode, the third signal having a frequency component equivalent to a difference between the first frequency component and the second frequency component, and detects a phase for the third signal;
a control portion that changes the differential balance for the mixer circuit according to a detection result from the phase detection portion,
wherein the mixer circuit operates in the first operation mode while the differential balance is set to a first correction value within a variable range, and
wherein the control portion, in the second operation mode, varies the differential balance and concurrently searches for a transition point allowing a phase for the third signal to transition by approximately 180° before and after varying the differential balance within a minimum fluctuation range and supplies the mixer circuit with the first correction value, namely, the differential balance corresponding to the transition point;
an analog-digital converter circuit provided after the mixer circuit;
a baseband circuit that performs a specified baseband process: and
a second switch that selects one out of transmitting an output from the analog-digital converter circuit to the baseband circuit and transmitting the output from the analog-digital converter circuit to the phase detection portion,
wherein the phase detection portion receives the second signal as a digital signal via the second switch,
wherein the test signal generating circuit includes:
a test local signal generating circuit that generates a test local signal having a specified frequency;
a test baseband signal generating circuit that generates a test baseband signal having a frequency equivalent to a difference between the first frequency component and the second frequency component;
a divider circuit that divides the test baseband signal into two; and
a test mixer circuit that up-coverts an output signal from the divider circuit using the test local signal, and
wherein the phase detection portion includes:
a digital filter circuit that extracts the third signal;
a digital amplifier circuit that amplifies an output signal from the digital filter circuit;
a test analog-digital converter circuit that converts the test baseband signal into a digital signal: and
a phase detection circuit that detects a phase for an output signal from the digital amplifier circuit with reference to a phase for an output signal from the test analog-digital converter circuit.

2. The high-frequency signal processor according to claim 1, wherein the control portion performs a binary search to sequentially halve a variable range of the differential balance and concurrently searches for the differential balance corresponding to the transition point.

3. The high-frequency signal processor according to claim 1, further comprising:
a low-noise amplifier circuit that is provided along a path from the antenna to the first switch.

* * * * *